United States Patent [19]
Hashimoto et al.

[11] Patent Number: 6,150,920
[45] Date of Patent: *Nov. 21, 2000

[54] RESISTOR AND ITS MANUFACTURING METHOD

[75] Inventors: Masato Hashimoto, Fukui; Shogo Nakayama, Wakayama; Shoji Mori, Fukui; Naohiro Takashima, Fukui; Seiji Tsuda, Fukui; Takumi Shirai, Osaka, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/865,110

[22] Filed: May 29, 1997

[30] Foreign Application Priority Data

| | | | |
|---|---|---|---|
| May 29, 1996 | [JP] | Japan | 8-134618 |
| Jun. 7, 1996 | [JP] | Japan | 8-145543 |
| Feb. 4, 1997 | [JP] | Japan | 9-021183 |

[51] Int. Cl.$^7$ .................................................. H01C 1/012
[52] U.S. Cl. .................... 338/309; 338/312; 338/323; 338/332
[58] Field of Search .................... 338/309, 312, 338/313, 332, 306; 361/770, 782

[56] References Cited

U.S. PATENT DOCUMENTS

| | | | |
|---|---|---|---|
| 4,529,960 | 7/1985 | Uchida et al. | 338/309 |
| 4,684,916 | 8/1987 | Ozawa | 338/308 |
| 4,780,702 | 10/1988 | Snel et al. | 338/308 |
| 5,111,179 | 5/1992 | Flassayer et al. | 338/313 |
| 5,294,910 | 3/1994 | Tani et al. | 338/306 |

FOREIGN PATENT DOCUMENTS

| | | | |
|---|---|---|---|
| 0 229 286 | 7/1987 | European Pat. Off. . | |
| 31 22 612 | 12/1982 | Germany . | |
| 1-289201 | 11/1988 | Japan | 338/328 |
| 1-47001 | 2/1989 | Japan | 338/313 |
| 3239301 | 10/1991 | Japan | 338/313 |
| 4-102302 | 3/1992 | Japan . | |

OTHER PUBLICATIONS

Patent Abstracts of Japan, vol. 96, No. 006, Jun. 1996 & JP 08 031603 A, Feb. 2, 1996.
Patent Abstracts of Japan, vol. 97, No. 001, Jan. 31, 1997 & JP 08 236325 A.

Primary Examiner—Karl Easthom
Attorney, Agent, or Firm—McDermott, Will & Emery

[57] ABSTRACT

The present invention is to offer a resistor which can be mounted exactly on the terminals disposed on a circuit board regardless the sides of the resistor, and to offer its manufacturing method by forming the surface of the side-electrode layer at a height higher than the surface of protection layer, or by forming the surface of the second surface electrode layer at a height higher than the surface of protection layer. By these, the resistor can be mounted exactly on the terminal of circuit board at a high yield. Furthermore, since the first surface electrode layer and the second upper electrode layer are electrically connected together through a window provided on the protection layer, a higher connection reliability can be obtained.

16 Claims, 21 Drawing Sheets

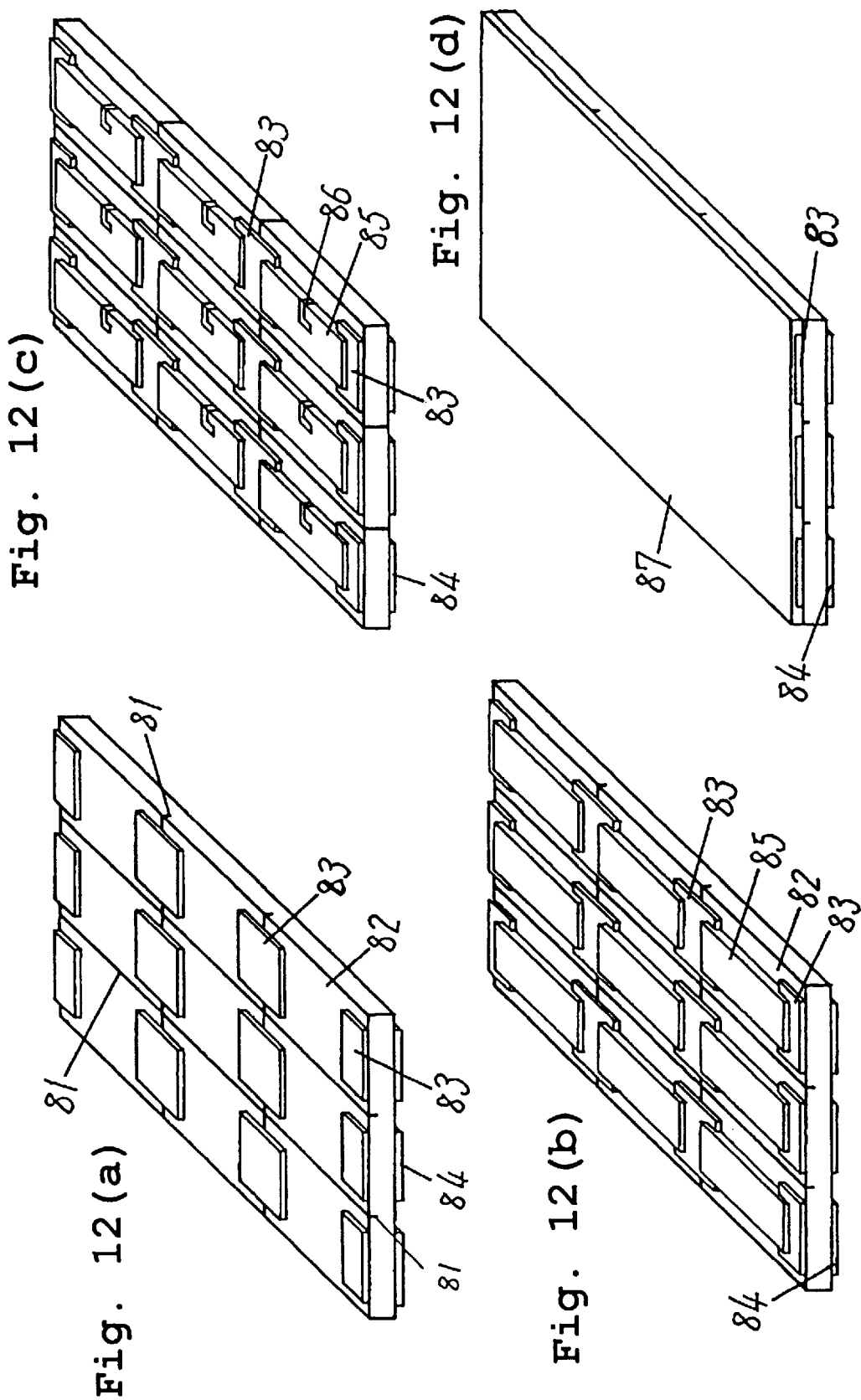

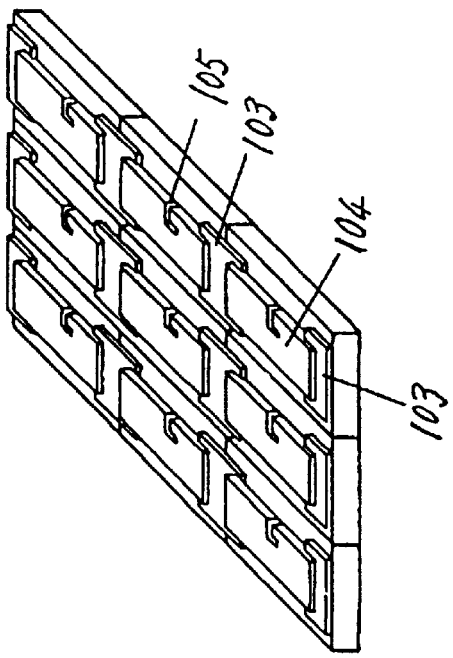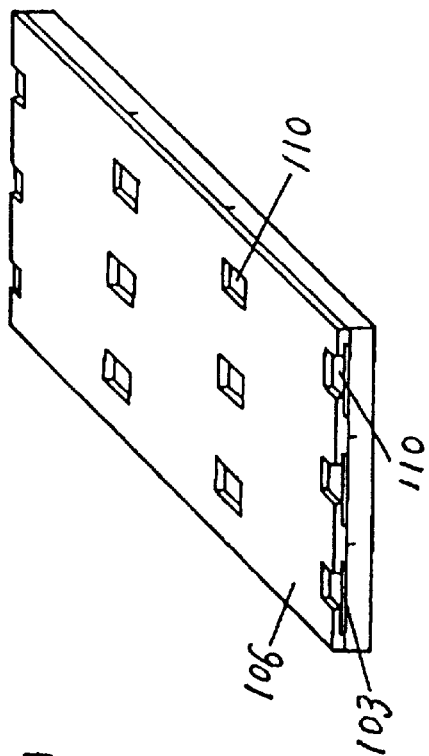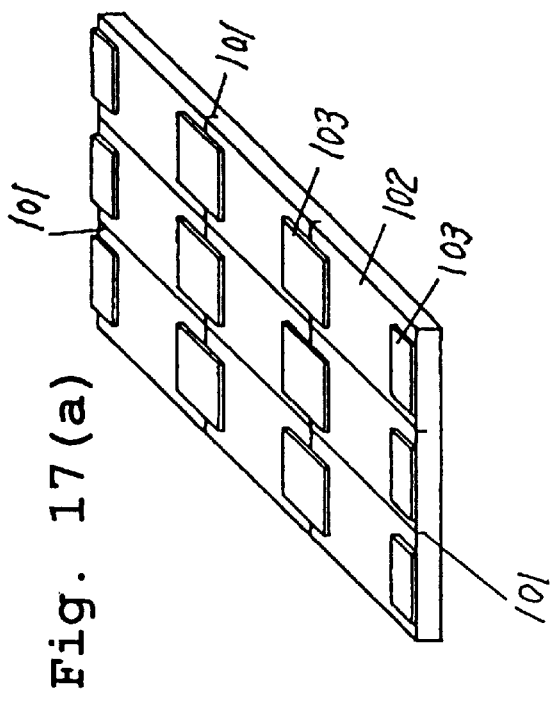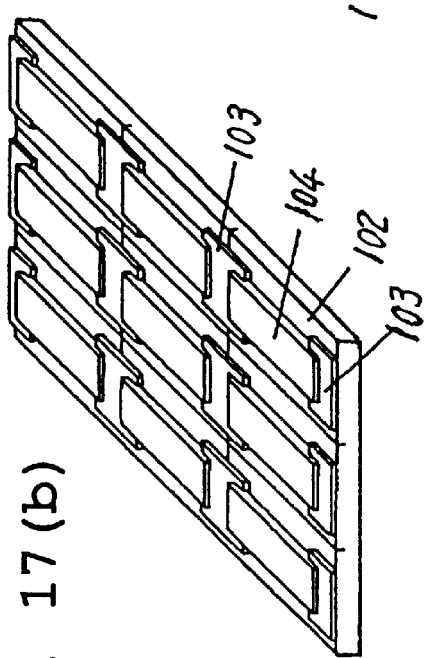
Fig. 17(a)
Fig. 17(b)
Fig. 17(c)
Fig. 17(d)

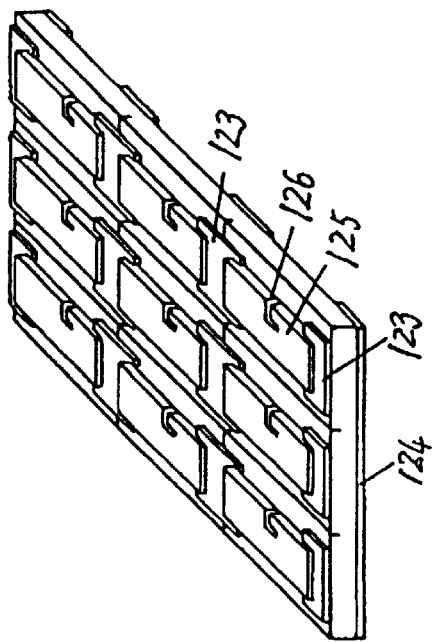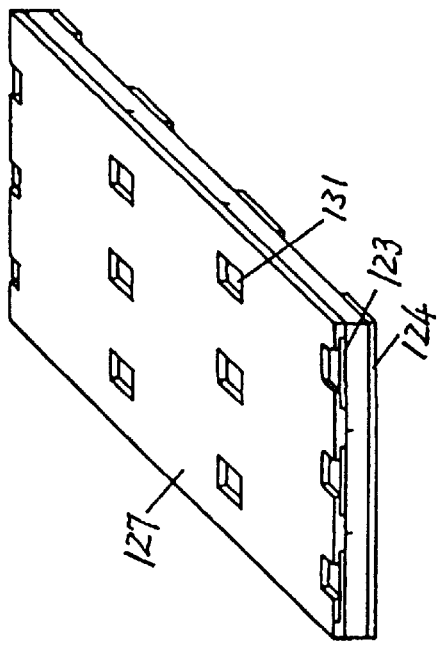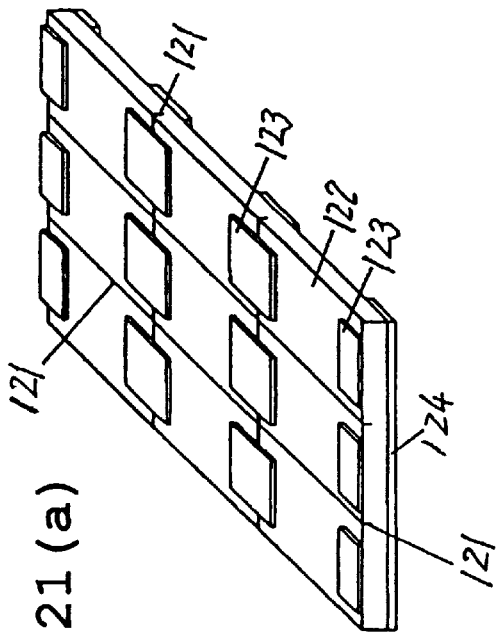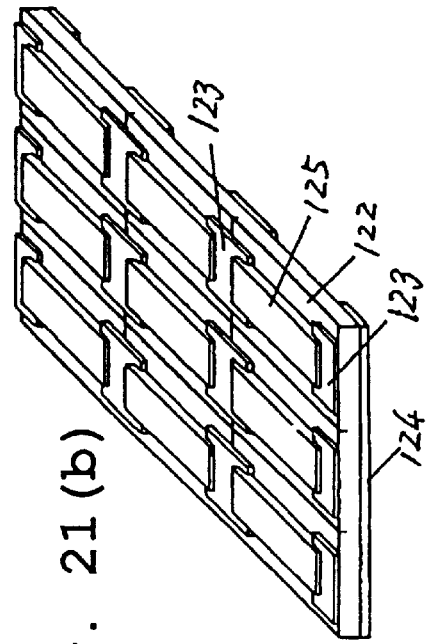

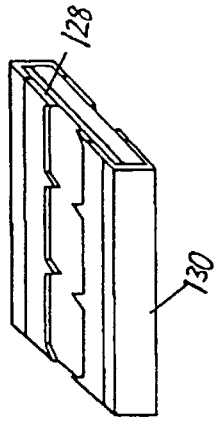
Fig. 22(c)
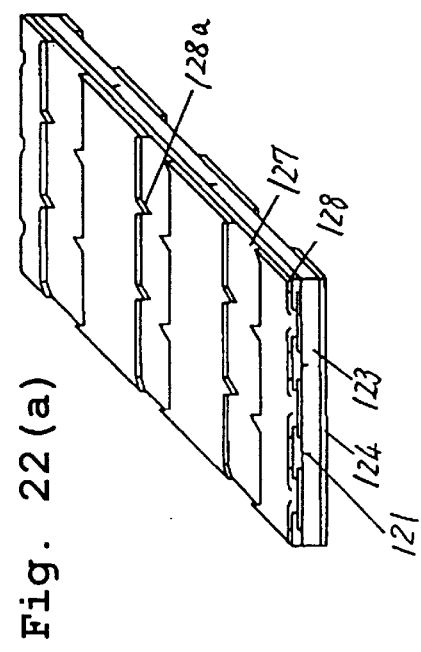
Fig. 22(a)
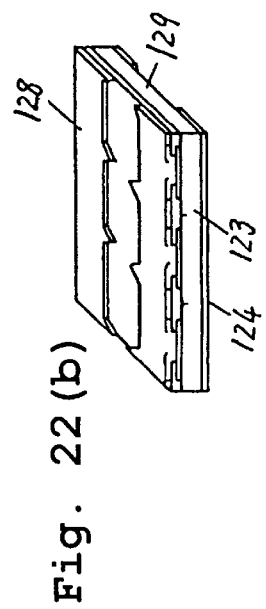
Fig. 22(d)
Fig. 22(b)
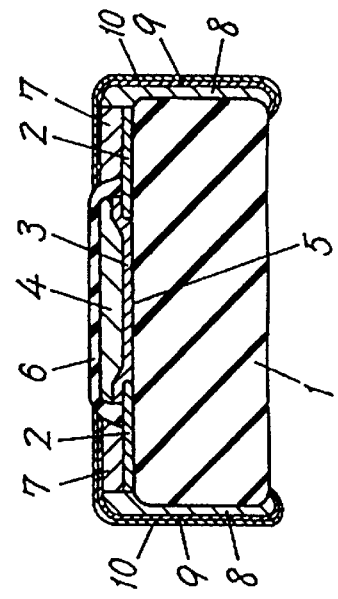
Fig 23
PRIOR ART

RESISTOR AND ITS MANUFACTURING METHOD

FIELD OF THE INVENTION

This invention relates to a resistor employed to manufacture a high-density circuit-board and a its manufacturing method.

BACKGROUND OF THE INVENTION

Whereas the conventional resistor such as the one disclosed by the laid-open patent Hei 4-102302 had been known, the conventional resistor and its manufacturing method are reviewed by referring attached drawing FIG. 23 showing a cross-section of the conventional resistor. In FIG. 23, 1 is an insulation substrate, 2 is a first surface electrode layer disposed on the left and right ends of insulation substrate 1, and 3 is a resistor layer disposed on first surface electrode layer 2 partly overlapping with first surface resistor layer 2. 4 is a first protection layer disposed to cover the entire surface of resistor layer 3, and 5s are trimming grooves disposed on resistor layer 3 and first protection layer 4, and said trimming grooves are cut when the resistance of resistor 3 has to be trimmed. 6 is a second protection layer disposed only on the surface of first protection layer 4, and 7 is a second surface electrode layer extended over the entire width of insulation substrate 1 on the surface of first surface electrode layer 2. 8s are side-electrode layers disposed on the both sides of insulation substrate 1, 9 and 10 are nickel-plated and solder-plated layers respectively disposed on second surface electrode layer 7 and side-electrode layer 8.

At this time, solder-plated layer 10 is disposed at a height lower than the height of said second protection layer 6. That is, second protection layer 6 is disposed at a highest height on the conventional resistor.

The manufacturing processes of conventional resistor having the above-shown construction are now explained below by referring the attached drawings.

FIGS. 24 and 25 show manufacturing processes of the conven-tional resistor. As shown in FIG. 24(a), first surface electrode layer 2 is formed by applying a coating on the left and right ends of insulation substrate 1. Then, as shown in FIG. 24(b), resistor layer 3 is formed by applying a coating on the both ends of insulation substrate 1 overlapping partly with resistor layer 3. Then, in next, as shown in FIG. 24(c), after coating first protection layer 4 covering the entire surface of resistor layer 3, trimming grooves 5 are formed on resistor layer 3 and first protection layer 4 by applying a laser-trimming method in order to set the resistance of resistor layer 3 within a predetermined range.

Then, as shown in FIG. 25(a), a second protection layer 6 is disposed on the surface of first protection layer 4, and as shown in FIG. 25(b), second surface electrode layer 7 is disposed on first surface electrode layer 2 extending over the entire width of insulation substrate 1. Then, as shown in FIG. 25(c), side-electrode layers 8 electrically connecting first surface electrode layer 2 to second surface electrode layer 7 are disposed on the both sides of insulating substrate 1. After applying a nickel-plating and a solder plating on the surfaces of second surface electrode layer 7 and side-electrode layer 8 as shown by a cross-section shown in FIG. 23, the resistor of conventional construction provided with nickel plated layer 9 and solder plated layer 10 are obtained.

However, with the resistor of conventional construction and manufacturing processes, since second protection layer 6 is deposited at a height higher than solder-plated layer 10, the resistor can be mounted on a circuit board (not shown) by utlizing only the back surface of insulation substrate 1. Therefore, there should be a definite disadvantage excluding the automatic resistor mounting machine from the mounting work of circuit boards because of the lack of ability discriminating the top or the bottom of resistors.

SUMMARY OF THE INVENTION

The object of the present invention is to offer resistors mountable on circuit board without discriminating the surface and back of resistor, and to offer a manufacturing process of such resistors.

Therefore, the resistor of a first construction is comprised of; a substrate, a pair of surface electrode layers disposed on both end surfaces of said substrate, a resistor layer disposed on said surface electrode layer making an electrical connection to said surface electrode layer, a protection layer disposed to cover at least said resistor layer, and slde-electrode layers superposed partly on the surface electrode layers protruding the superposed part from said surface electrode layer making electrical connections there between, and said side-electrode layers make said superposed region protruded from said protection layer.

Furthermore, the resistor of the present invention is comprised of; a substrate, a pair of upper surface electrode layers and a pair of back electrode layers respectively disposed on the both ends of surface and back of said substrate, a resistor layer disposed making an electrical connection to said surface electrode layer, a protection layer covering at least said resistor layer, and side-electrode layers disposed on the sides of said substrate covering said back-electrode layer and a part of said upper surface electrode layer making electrical connections there between, and making the superposed parts higher than said protection layer.

Then, in next, the resistors of a second construction is comprised of; a substrate, a pair of first surface electrode layers disposed on both ends of said substrate, a resistor layer disposed on the surface of said substrate making electrical connections to said both ends of surface electrode layers, a protection layer disposed to cover at least said first surface electrode layer and said resistor layer, a pair of second surface electrode layers disposed on both ends of said surface protection layer, and side electrode layers disposed at least on the sides of said substrate making electrical connections to said first and second surface electrode layers.

Furthermore, the invented resistor can be comprised of; a substrate, pairs of first surface electrode layers and back electrode layers, a resistor layer disposed on a surface of said substrate making electrical connections to said first surface electrode layer, a protection layer to cover at least said first surface electrode layer and said resistor layer, a pair of second surface electrode layers disposed on both end surfaces of said protection layer, and side electrode layers disposed on the sides of said substrate making electrical connections to said first and second surface electrode layers and said back electrode layer.

Moreover, a manufacturing process of the invented resistor of a second construction is comprised of; a process disposing a first surface electrode layer crossing over dividing grooves formed on a sheet-shaped substrate, a process to dispose a resistor layer electrically connecting between said first surface electrode layers, a process to dispose a protection layer to cover at least said first surface electrode layers and said resistor layer a process to dispose a second surface electrode layer on both ends of said surface protection layer, a process to divide said sheet-shaped substrate provided with dividing grooves into rectangular-shaped substrates, a process to provide side-electrode layers on the side of said divided rectangular-shaped substrates making electrical connections between said first surface electrode layer and said second surface electrode layer, and a process to divide said rectangular-shaped substrate provided with side-electrodes into individual substrates.

Another manufacturing process of the resistor of a second construction is comprised of; a process to dispose a first surface electrode layer and a back-electrode layer crossing over the surface and the back of dividing groove formed on said sheet-shaped substrate, a process to dispose a resistor layer electrically connecting between said surface electrode layers, a process to dispose a protection layer covering at least said first surface electrode layer and said resistor layer, a process to dispose a second surface electrode layer on both end surfaces of said surface protection layer, a process to divide said sheet-shaped substrate provided with said surface electrode layer and said dividing grooves into rectangular-shaped substrates, and a process to dispose side-electrode layers electrically connecting said first and second surface electrode layers and said back electrode layer, and a process to divide said rectangular-shaped substrate on which said side-electrode layers are fornmed into individual substrates.

The invented resistor of a third construction is comprised of; a substrate, a pair of first surface electrode layers disposed on both ends of said substrate, a resistor layer disposed on the surface of said substrate establishing electrical connections to said first surface electrode layers, a protection layer disposed to cover at least said first surface electrode layer and the surface of said resistor layer, a pair of second surface electrode layers disposed on both ends of said protecting layers, and side-electrode layers disposed at least on the sides of said substrate electrically connecting said first surface electrode layer to said second surface electrode layer, wherein said protection layer is provided with a window on said first surface electrode layer, and said first surface electrode layer and said second surface electrode layer are electrically connected through said window, and said second electrode layers are provided with corners at the mutually faced corners at the same time.

Furthermore, the invented resistor can be comprised of; a substrate, a pair of a first surface electrode and the back electrode layers respectively disposed on both ends of the upper surface and the back surface of said substrate, a resistor layer disposed on said substrate connected to said first surface electrode layer, a protection layer disposed to cover at least said first surface electrode layer and said resistor layer, a pair of a second surface electrode layers disposed on both ends of said protection layer, and at least said slde-electrode layers are disposed on the sides of said substrate electrically connecting said first and said second surface electrode layer to said back electrode layer, wherein said protection layer is provided with a window on the surface of a first surface electrode layer, making electrical connections between said first surface electrode layer and said second surface electrode layer through said window, and said second electrode layers are provided with corners at the mutually faced corners at the same time.

Moreover, the manufacturing process of the invented resistor of a third construction is comprised of; a process to dispose a first surface electrode layer crossing over the dividing grooves formed on the sheet-shaped substrate, a process to dispose the resistor layer connecting electrically between said first upper electrode layers, a process to dispose a protection layer covering the surfaces of said first surface electrode layer and said resistor layer, a process to dispose a second surface electrode layer on said protection layer, a process to divide said sheet-shaped substrate provided with dividing grooves and a second surface electrode layer into individual rectangular-shaped substrates, and a process to dispose side-electrode layers electrically connecting said first and second upper electrode layers and said back electrode layer together on the sides of said rectangular-shaped substrates, and a process to divide said rectangular-shaped substrates provided with side-electrodes into individual substrates, wherein said protection layer is provided with a window on said first surface electrode layer, and said first surface electrode layer and said second surface electrode layer are mutually connected electrically through said window, and said second electrode layer is provided with corners on the mutually facing corners.

In addition to these, the manufacturing process of the invented another resistor of a third construction is comprised of; a process to dispose a first surface electrode layer and back electrode layer crossing over the dividing grooves disposed on upper and back surface of said sheet-shaped substrate, a process to dispose a resistor layer connecting electrically between said surface electrode layers, a process to dispose a protection layer covering at least said first surface electrode layer and said resistor layer, a process to dispose a second surface electrode layer on both ends of said surface electrode layer, a process to divide said sheet-shaped substrate provided with dividing grooves forming said second surface electrode layers, a process to dispose side-electrode layers at least on the sides of said rectangular-shaped substrate by which said first and second surface electrode layers are electrically connected, and a process to divided said rectangular-shaped substrates on which said side-electrode layers are formed into individual substrates, wherein said protection layer is provided with a window on said first surface electrode layer, and said first surface electrode layer and said second surface electrode layer are mutually connected electrically through said window, and said second surface electrode layer is provided with corners on the mutually facing corners.

As shown in above, since the invented resistor is provided with side-electrodes and a second surface electrode disposed at a height higher than said protection layer, the obtained resistors has an advantage that the resistors can be mounted on circuit boards by means of automatic mounting machine without discriminating the top or bottom of resistors.

BRIEF DESCRIPTION OF THE DRAWINGS

FIGS. 12(a)–10(d) show manufacturing processes of the same resistor

FIGS. 17(a)–17(d) show manufacturing processes of the same resistor.

FIGS. 21(a)–21(d) show manufacturing processes of the same.

FIGS. 22(a)–22(d) show manufacturing processes of the same.

FIG. 23 shows a cross-section of the conventional resistor.

DESCRIPTION OF PREFERRED EMBODIMENTS

Figure 1:
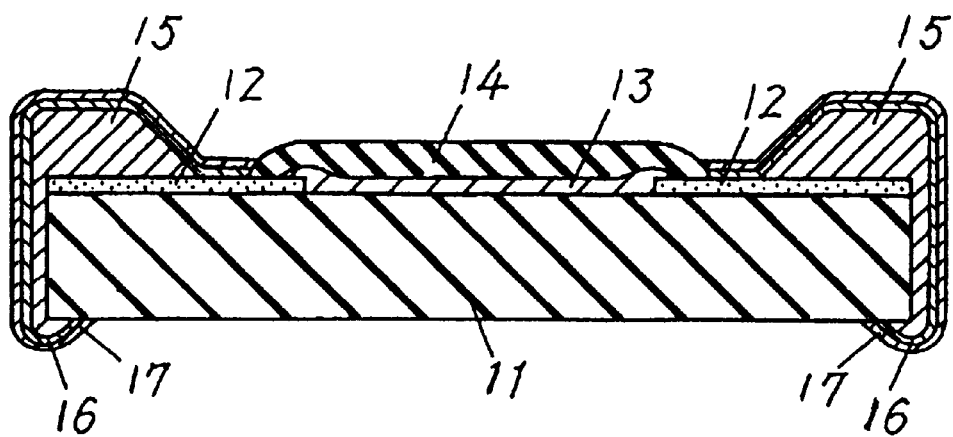
FIG. 1 show a cross-section of the resistor which is a first embodiment of the invention.

A first embodiment of the invention is now explained below by referring the attached drawings. In FIG. 1, 11 is a substrate made of alumina or such, 12s are a pair of surface electrode layers made of a mixed material consisted of silver and glass disposed on the both ends of substrate 11, and this should preferably be disposed to the side ends of substrate 11. 13 is a resistor layer made of a mixed material consisted of ruthenium oxide and glass disposed on the substrate 11 and on the both ends of surface electrode layers 12 making electrical connections thereto also. 14 is a protection layer made of boro-silicate lead glass disposed to cover at least the surface of resistor layers 13. 15s are side electrodes made of a mixed material consisted of silver and glass disposed on the both sides of substrate 11 and both ends of surface electrode layer 12, and a part of surface electrode layers 12 producing an electrically superposed region at a height higher than the surface of protection layer 14, producing also rounded edges of side-electrode layers 15. 16 is an electroplated layer made of a metal such as nickel to cover side-electrode layers 15s when it is necessary. 17s are solder layers disposed to cover said nickel-plated layers 16 when necessary, and these should preferably be provided with rounded edges of solder layers 17.

The manufacturing processes of resistor of the above-shown construction are now explained below be referring the attached drawings FIGS. 2 and 3 showing a manufacturing method of resistor which is a first embodiment of the invention.

Figure 2A:
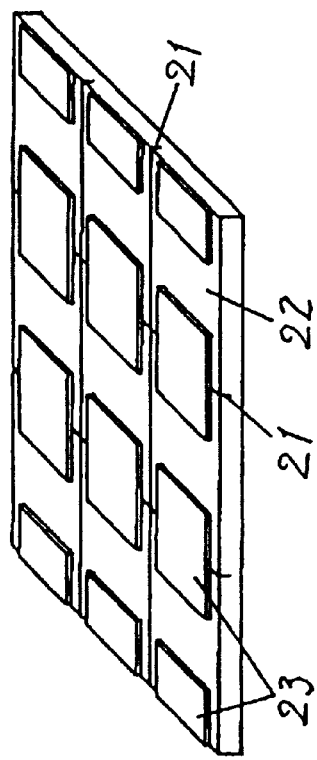
FIGS. 2(a)–2(d) show manufacturing processes of the resistor which is the same embodiment of the invention.

As shown in FIG. 2(a), after a mixed paste material consist-ed of silver and glass is screen-printed on sheet-formed subst-rate 22 made of alumina crossing over vertical and horizontal dividing grooves 21 disposed on said substrate 22, and are dried and sintered in a belt-system continuous furnace at a temperature of about 850° C. kept for a period of about 45 minutes. Surface electrode layer 23 is formed by this.

Figure 2B:
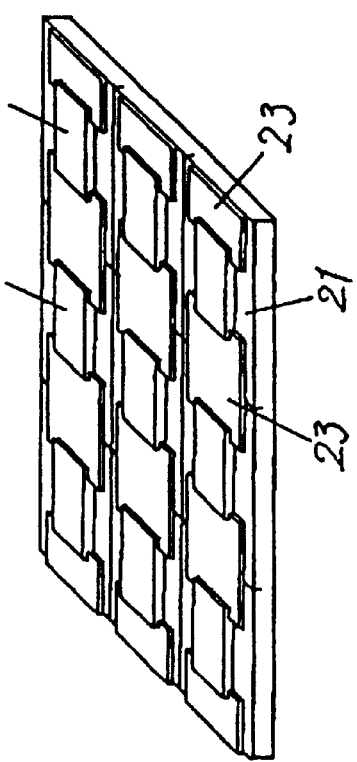

Then, as shown in FIG. 2(b), after a mixed paste material consisted of ruthenium oxide and glass is screen-printed on the surface of sheet-shaped substrate 22 superposing on each end of surface electrode layers 23 in order to electrically combine surface electrode layers 23, these are dried and sintered in a belt-system continuous furnace at a temperature of about 850° C. for a period of about 45 minutes. Resistor layers 24 are formed by this.

Figure 2C:
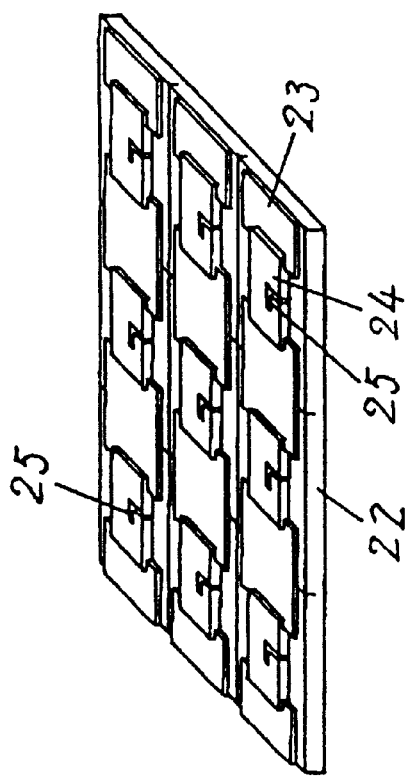

In next, as shown in FIG. 2(c), the resistance of resistor layer 24 is trimmed by using a laser trimmer, forming trimming grooves 25. At this time, trimming grooves may be formed by cutting resistor layer 24 and the coating layer altogether after at least the surface of resistor layer 24 are covered by a coating layer (not shown) made of glass or others.

Figure 2D:
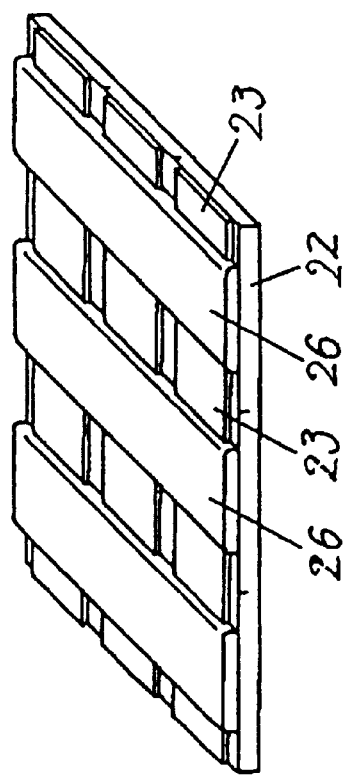

As shown in FIG. 2(d) in next, after a boro-silicate lead glass paste is screen-printed in order to completely cover surface resistor layer 24, the paste is dried and sintered in a belt-system continuous furnace at a temperature of about 850° C. for a period of about 45 minutes, and by this, protection layers 26 is formed.

Figure 3A:
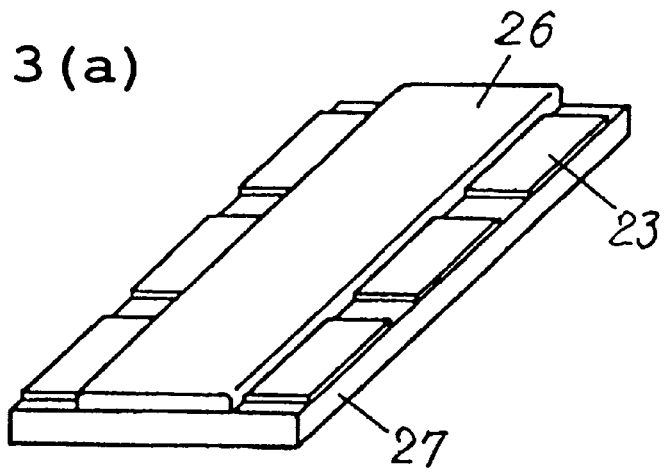
FIGS. 3(a)–3(c) show manufacturing processes of the resistor which is the same embodiment of the invention.

Then, as shown in FIG. 3(a), sheet-shaped substrate 22 is divided along dividing grooves 21, exposing surface electrode layers 23 from the sides of substrate, and forming rectangular-shaped substrates 27.

Figure 3B:
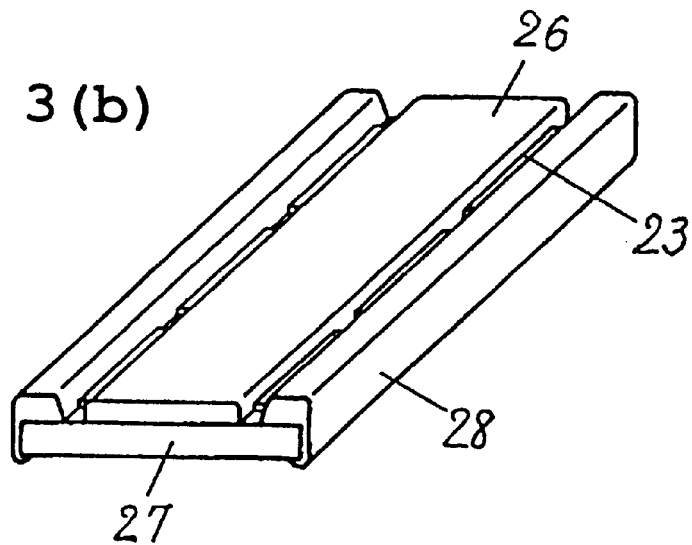

In next, as shown in FIG. 3(b), after a mixed paste prepared by mixing silver and glass is transfer-printed by a roller on the side of rectangular-shaped substrate 27 forming an overlapped part on surface electrode layer 23 which is made higher than the surface of protection layer 26, the paste is dried and sintered in a belt-system continuous furnace at a temperature of about 600° C. for a period of about 45 minutes forming side-electrode layers 28.

Figure 3C:
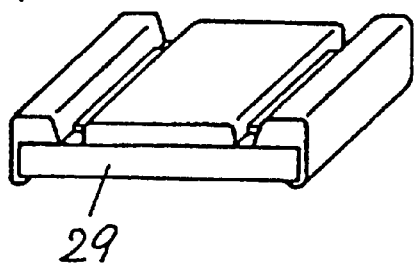

As shown in FIG. 3(c), rectangular-shaped substrates 27 are then divided into individual substrates producing individual pieces of resistors 20 at the last stage.

Then, at the last stage, according the a necessity, a metal plated layer such as a nickel plated layer covering the exposed parts of surface electrode layer 23 and side-electrode layer 28 is formed, and at the same time, a solder plated layer (not shown) made of an alloy of tin and lead is disposed over the metal plated layer, and by this, the resistors are produced.

Although a case where a protection layer is made of a boro-silicate lead glass material has been explained for far, nearly the same effects could be obtained by using an epoxy resin material. In addition to this, although a mixed paste material obtained by mixing silver and glass is used as a side-electrode material has been explained in this embodiment of the invention, the same effects could be obtained even when a mixed material consisted of nickel and phenol resin were used.

Results experimenting the resistors of above-construction and obtained with the conventional resistors mounting on circuit boards are now explained in below.
(Experimental Method)

Using an automatic electronic component placement machine (made by Matsushita Elec. Ind. Co. Ltd., Panasert MV2), a bulk one by one cassette mounting is performed, then a re-flow soldering is fulfilled at 200–250° C. for 10–30 seconds thus resistors are mounted on a circuit board. In this situation, about half of the resistors are soldered to the terminals of the circuit board facing downwardly.
(Judgments of The Results)

Figure 4A:
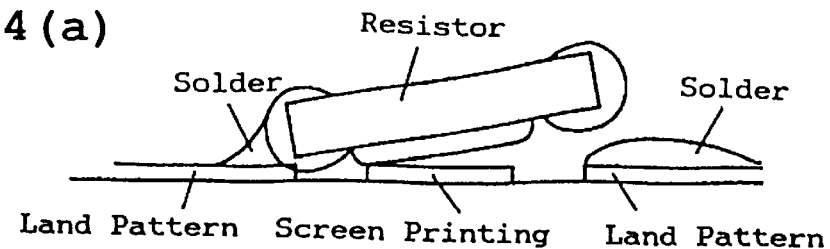
FIGS. 4(a)–4(b) show a drawing illustrating a mounting failure found at the mounting of the resistor on a circuit board.
Figure 4B:
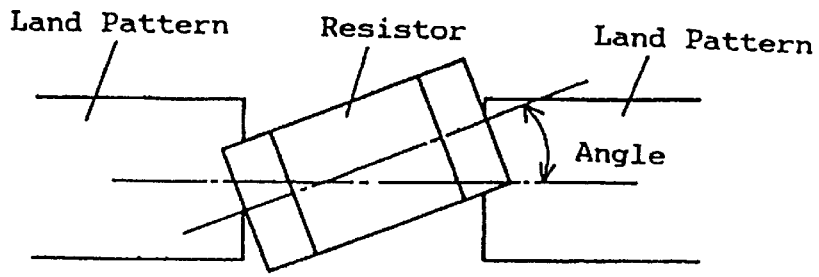

As for the resistor chips of which a side is not bonded as shown in FIG. 4(a), the cases where one sides of solder lands are found unsoldered are judged unacceptable. As for the miss-registration of mounting angle to the soldering land on the circuit board, the cases where the resistors on the soldering lands are found rotated for more than an angle of 0.2 degree are judged unacceptable.

Table 1 shows relationships between the heights of side-electrode layer above the surface of protection layers and the unacceptable mountings for the experimented resistors having a construction of the first embodiment of the invention and for the conventional resistors.

TABLE 1

|  | Conventional Example-1 | Conventional Example-2 | Experimented Example-1 | Experimented Example-2 |
|---|---|---|---|---|
| Height differences, protection layer/side-electrode ($\mu$m) | −5 | 0 | 5 | 10 |
| Exp. Unacceptable Results connections | 25 | 4 | 0 | 0 |
| (*) Off-angle Mountings | 100 | 16 | 2 | 0 |

(*): Unacceptable connections for mounting 10.0000 samples.

As shown in Table 1, since the invented resistors are provided with side-electrode layers disposed at a height higher than the surface of protection layer by more than 5 microns, the numbers of unacceptable connections are far less than the cases of conventional resistors.

Figure 5:
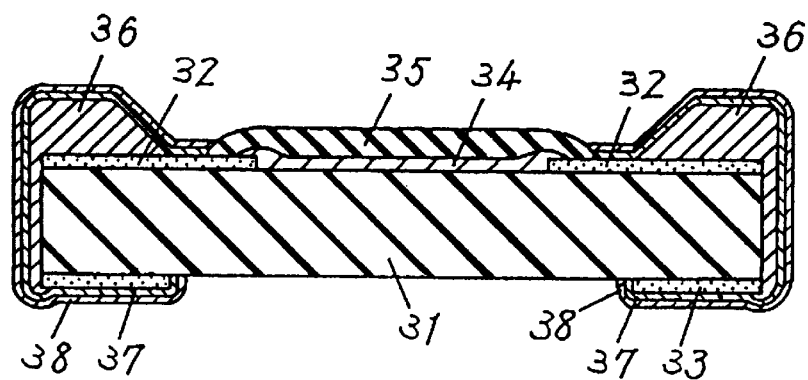
FIG. 5 is a cross-section of the resistor which is a second embodiment of the invention.

The cases of a second embodiment of the invention are now explained below. FIG. 5 shows a cross-section of the resistor which is a second embodiment of the invention. In FIG. 5, 31 is a substrate made of a material such as alumina. 32s are a pair of surface electrode layers made of a mixed material consisted of silver and glass which is preferred to be disposed up to the ends of substrate 31. 33 is a pair of back electrode layers made of a mixture of silver and glass, and it is preferable to dispose them to the side ends of the substrate 31. 34 is a resistor layer made mainly of a mixed material obtained by mixing ruthenium oxide and glass disposed on the surface of substrate 31 and superposed on the both ends of upper electrode layers 32 also in order to establish electrical connections thereto. 35 is a protection layer made mainly of a boro-silicate lead glass disposed to cover at least the surface of resistor layers 34.

36 is a side-electrode layer made mainly of a mixed material obtained by mixing silver and glass, and is disposed on the sides of substrate 31, superposed both ends of surface electrode layers 32, and on a part of the surface of surface electrode layers 32, establishing electrical connections thereto, making the supper-posed part is higher than the surface of protection layer 35, and the edges of side-electrode layers 36 rounded.

37 is an electro-plated layer such as a nickel plated layer covering the side-electrode layers 36 if necessary. 38 is a solder layer covering plated layer 37 if necessary, and said solder layer should preferably be provided with rounded edges.

Figure 6A:
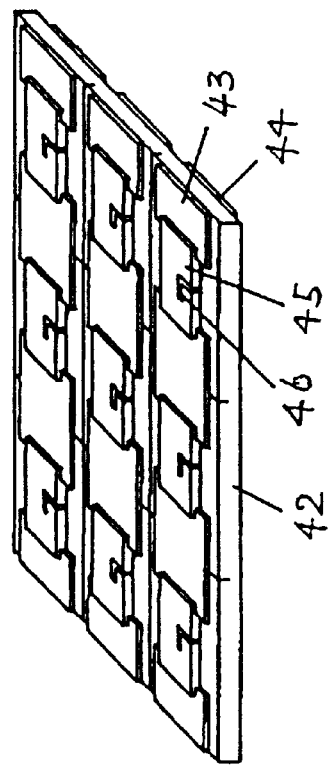
FIGS. 6(a)–6(d) show manufacturing processes of the resistor which is the same embodiment of the invention.
Figure 6D:
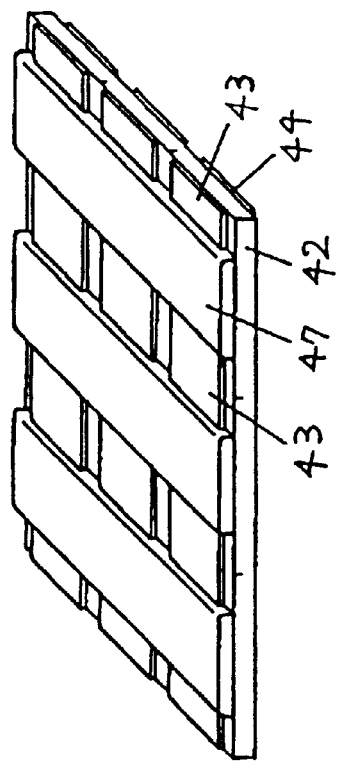
Figure 6B:
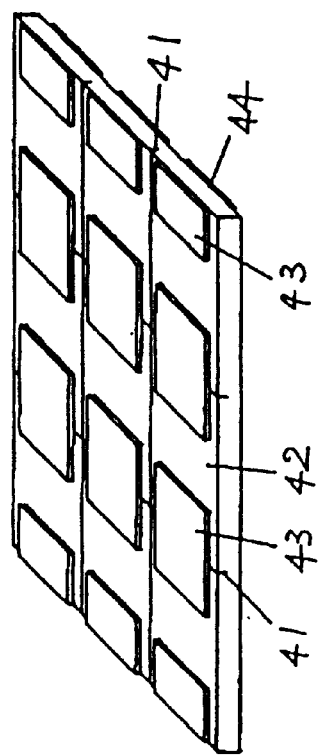
Figure 6C:
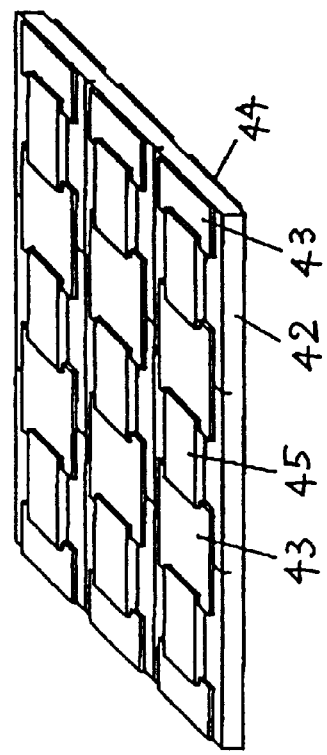
Figure 7A:
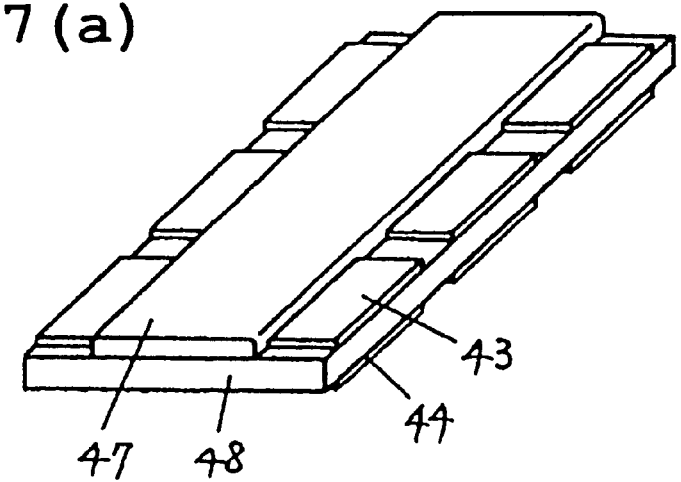
FIGS. 7(a)–7(c) show manufacturing processes of the same resistor.

As for the resistors of above-explained construction, its manufacturing method is now explained by referring the attached drawings FIGS. 6 and 7 which show manufacturing processes of resistor which is a second embodiment of the invention. As shown in FIG. 6(a), after a mixed paste material consisted of silver and glass is screen-printed on a sheet-shaped substrate 42 provided with vertical and horizontal dividing grooves 41 on its both surfaces, the paste is dried. Then, after the sheet-shaped substrate 42 is reversed and the same paste material is screen-printed again over the dividing grooves (not shown) and is dried. After this, substrate 42 is sintered in a belt-type continuous furnace at a temperature of about 850° C. for a period of about 45 minutes forming surface electrode layer 43 and back electrode layer 44.

Then, as shown in FIG. 6(b), after a mixed paste material consisted of ruthenium oxide and glass is screen-printed on the surface of sheet-shaped substrate 42 crossing over the respective edges of surface electrode layer 43 and connecting these electrically, a printed mixed paste material is dried and placed in a belt-type continuous furnace and is sintered at a temperature of about 850° C. for a period of about 45 minutes forming resistor layers 45.

As shown in FIG. 6(c), by using a laser trimmer or such, a trimming process to trim the resistance of resistor layer 45 and to form trimming grooves 46. At this time, after the surface of resistor layer 45 (not shown) is coated with a material such as glass, both the coating layer and the resistor layer may be trimmed at once by using a laser trimmer through the coating layer, and by this, trimming grooves 46 are formed.

Then, as shown in FIG. 6(d), after a mixed paste material made of boro-silicate lead glass is screen-printed on the surface of resistor layer 45 covering completely the surface of resistor 45, the paste is dried and is sintered in a belt-type continuous furnace at a temperature of about 850° C. for a period of about 45 minutes forming protection layer 47.

Figure 7B:
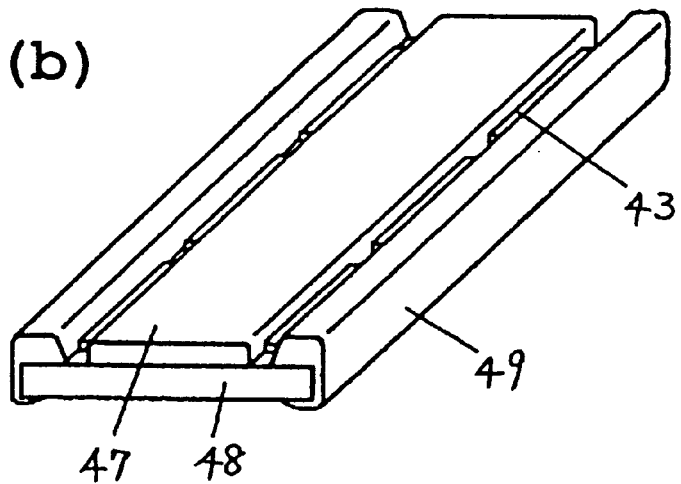

Then, as shown in FIG. 7(b), sheet-shaped substrate 42 is divided along dividing grooves 41 exposing surface electrode layers 43 from the side of substrate, and rectangular-shaped substrates 48 are obtained.

In next, as shown in FIG 7(b), after a mixed paste material consisted of silver and glass is transfer printed by using a roller on the both sides of rectangular substrates 48 superposing on a part of surface electrode layers 43, making the superposed area is higher than the surface of protection layer 47 at the same time, the paste is dried and is sintered in a belt-type continuous furnace at a temperature of about 600° C. for a period of about 45 minutes, and by this, side electrode layers 47 are formed.

Figure 7C:
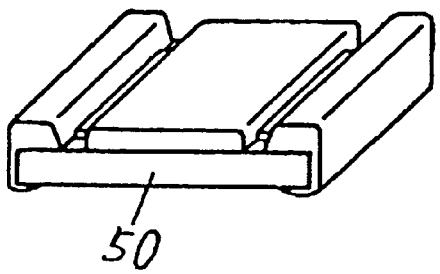

As shown in FIG. 7(c), then, rectangular substrate 48 is divided into individual resistors 50.

Then, at the last, by forming a plated layer (not shown) of such as a nickel plated layer covering the exposed parts of sur-face electrode layer 43 and side-electrode layer 49 if needed, and by forming a solder layer (not shown) made of an alloy of tin and lead covering said plated layer, the resistors can be obtained.

Although cases using a boro-silicate lead glass as a material of the protection layer have been explained, the same effects can be obtained by using an epoxy resin system material.

Although cases using a mixed material consisted of silver and glass as a material of side electrode have been explained in this embodiment of the invention, the same effects can be obtained by using a mixed material consisted of nickel and phenol resin.

The experimental results obtained by mounting the resistors of a above-explained construction and the conventional resistors are now explained in the followings. The experimental method and the judgment of the results employed in these experiments are identical with those shown in a first embodiment of the invention.

Table 2 shows relationships between the heights of side-electrode layers above the surface of protection layers and the unacceptable connections for the experimental resistors having a second construction and the conventional resistors.

TABLE 2

|  | Conventional Example-1 | Conventional Example-2 | Experimented Example-1 | Experimented Example-2 |
|---|---|---|---|---|
| Height differences, protection layer/side-electrode ($\mu$m) | −5 | 0 | 5 | 10 |
| Exp. Unacceptable Results Connections | 32 | 2 | 0 | 0 |
| (*) Off-angle Mountings | 83 | 9 | 0 | 0 |

(*): Unacceptable connections for mounting 10.0000 samples

As shown in Table 2, since the invented resistors are provided with side-electrode layers disposed at a height higher than the surface of protection layer by more than 5 microns, the number of unacceptable connections are far less than the ones in the cases of conventional resistors.

Figure 8:
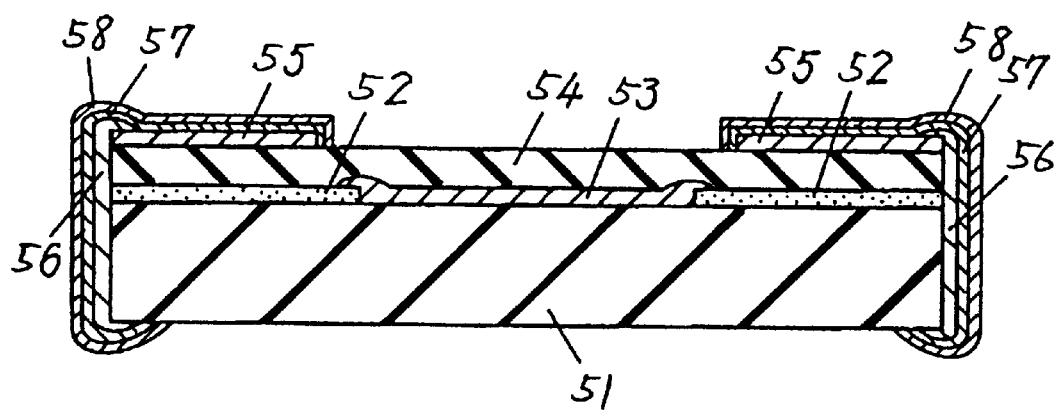
FIG. 8 shows a cross-section of the resistor which is a third embodiment of the invention.

A third embodiment of the invention is now explained by referring FIG. 8 showing a cross-section of resistor which is a third embodiment of the invention.

In FIG. 8, 51 is a substrate made of a material such as alumina. 52 are a pair of the first surface electrode layers made of a mixed material consisted of silver and glass, and this would be preferred to dispose up to the side ends of substrate 51. 53 is a resistor layer made mainly of a mixed material consisted of ruthenium oxide and glass disposed on the surface of substrate 51 and on the both ends of the first surface electrode layer 52 making electrical connections thereto. 54 is a protection layer made mainly of a boro-silicate lead glass or epoxy resin disposed to on first surface electrode layer 52 and resistor layers 53, and preferably to the side ends of substrate 51. 55 are a pair of second surface electrode layers made mainly of a mixed material consisted of silver and glass or made of phenol resin disposed preferably to the side ends of substrate 51. 56 are side electrode layers made mainly of a mixed material consisted of silver and glass electrically connecting the side of the substrate 51, the first surface electrode layer 52 and the second surface electrode layer 55, and these are provided with rounded edges. 57 is a nickel plated layer covering side-electrode layer 56. 58 is a solder layer disposed to cover plated layer 57 if necessary, having rounded edges preferably.

As for the resistor layer of above-explained construction, its manufacturing method is now explained below by referring the attached drawings FIGS. 9 and 10 showing its manufacturing processes. As shown in FIG. 9(a), after a mixed paste material made of silver and glass is screen-printed on horizontal dividing grooves 61 disposed on sheet-shaped substrate 62 made of alumina or others provided with both the horizontal and vertical dividing grooves, the paste is dried, and is sintered in a belt-type continuous furnace at a temperature of about 850° C. for a period of about 45 minutes forming first surface electrode layers 63.

Figure 9C:
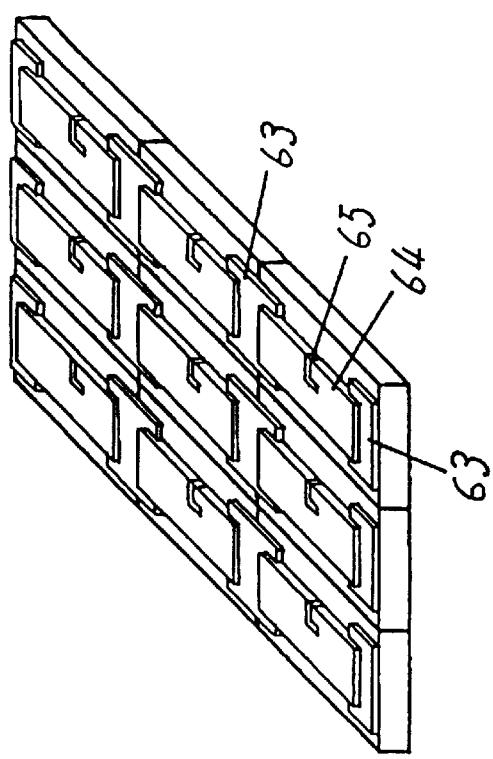
FIGS. 9(a)–9(d) show manufacturing processes of the resistor which is the same embodiment of the invention.
Figure 9D:
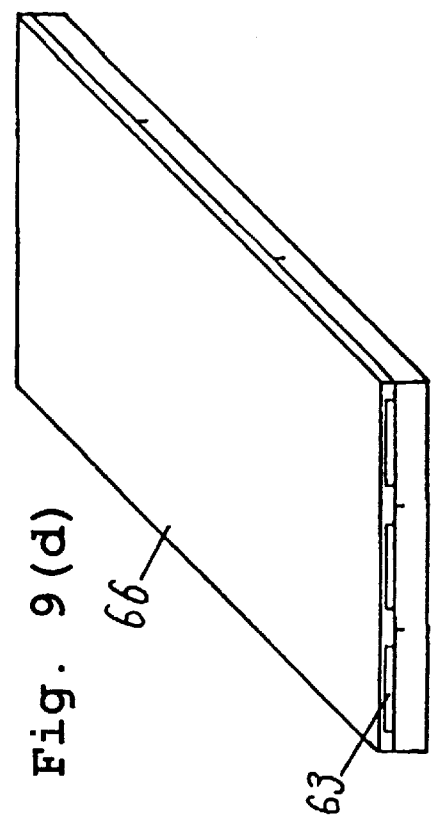
Figure 9A:
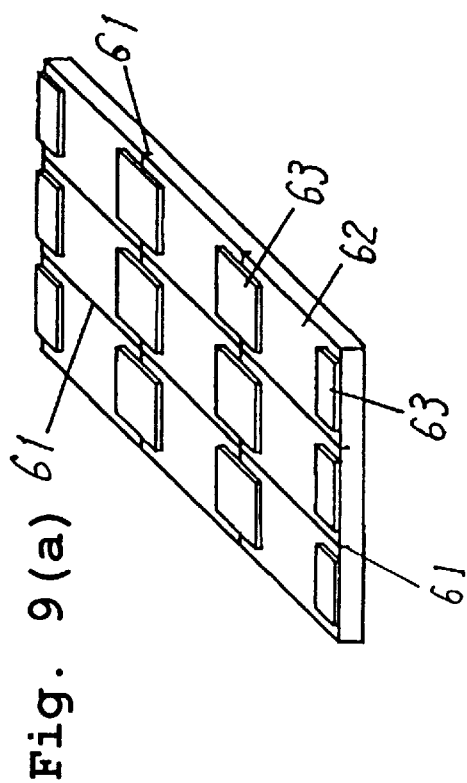
Figure 9B:
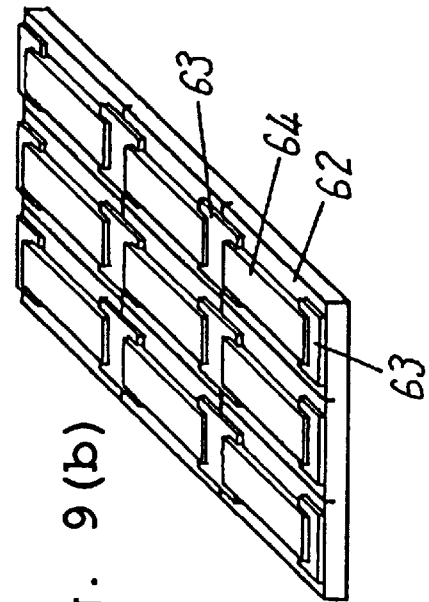

As shown in FIG. 9(b), then, after a mixed paste material made of ruthenium oxide and glass is screen-printed on the surface of sheet-shaped substrate 62 in order to establish electrical connections betwen first surface electrode layers 63, this is placed in a belt-type continuous furnace to dry and is sintered at a temperature of about 850° C. for a period of about 45 minutes, forming resistor layers 64.

As shown in FIG. 9(c) in next, by using a laser trimming device or such, a process to trim the resistance of resistor layer 64 is performed, and by this, trimming grooves 65 are formed. At this time, after the surface of resistor layer 45 is coated (not shown) by a material such as glass, both the coating layer and the resistor layer 64 may be trimmed through the coating layer, and by this, trimming grooves 65 are formed.

In next, as shown in FIG. 9(d), after a boro-silicate lead glass paste is screen-printed on the entire surfaces of first surface electrode layer 63 and resistor layer 64, the paste is dried and is sintered in a belt-type continuous furnace at a temperature of about 600° C. for a period of about 45 minutes, forming protection layer 66. At this time, protection layer 66 has to be deposited to cover at least first surface electrode layer and resistor layer 64.

Figure 10A:
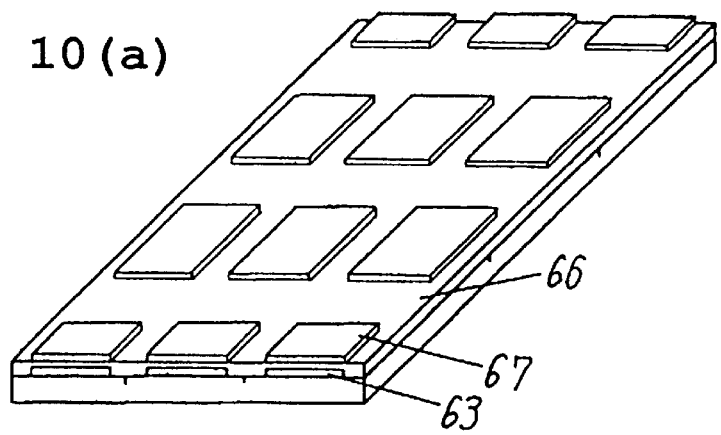
FIGS. 10(a)–10(d) show manufacturing processes of the same.
Figure 10B:
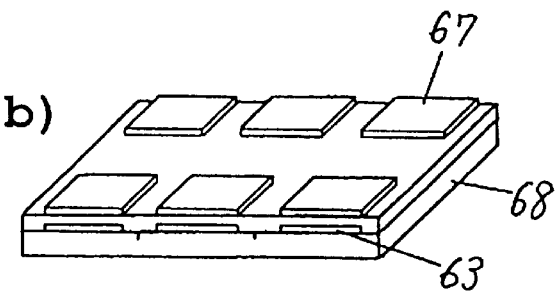

Then, as shown in FIG. 10(a), a paste material consisted of silver and glass is screen-printed on the surface of protection layer 66 and dried. This is then placed in a belt-type continuous furnace and is sintered at a temperature of about 600° C. for a period of about 45 minutes forming the second surface electrode layer 67. Then, in next, as shown in FIG. 10(b), sheet-shaped substrate 62 is divided along dividing grooves 61 exposing the first and the second surface electrode layers from the sides of substrate, and rectangular substrates 68 are formed by this.

Figure 10C:
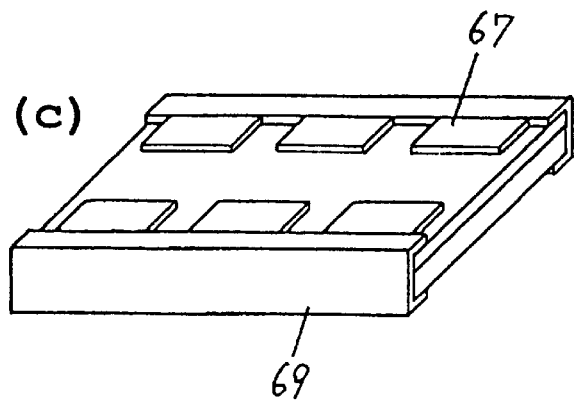
Figure 10D:
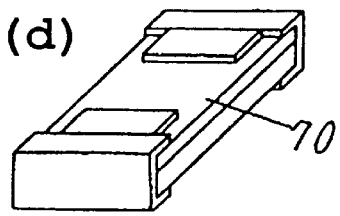

Then, as shown in FIG. 10(c), a mixed paste material consisted of silver and glass is transfer-printed by a roller on the sides of rectangular substrate 68 in order to electrically connect first surface electrode layer 63 to second surface electrode layer 67 and dried. This is then placed in a belt-type continuous furnace and is sintered at a temperature of about 600° C. for a period of about 45 minutes forming side-electrode layers 69.

As shown in FIG. 3(d), rectangular substrate 68 is divided into individual substrates producing individual resistor chips 70. Then, at the last, according to a neccessity, an electro-plated layer (not shown) such as a nickel plated layer is formed to cover side-electrode layer 69, and at the same time, a solder layer (not shown) such as a layer on which an alloy of tin and lead is plated is deposited, and by this, the resistors are produced.

The experimental results obtained by mounting the resistors of above-explained construction and the conventional resistors on circuit boards are now explained below. The experimental methods and the judgments of the results employed in these experiments are identical with those shown in the first embodiment of the invention.

Table 3 shows relationships between the heights of second surface electrode layers above the surface of protection layers and the unacceptable mountings for the experimental resistors of a second construction and the conventional resistors.

TABLE 3

|  | Conventional Example-1 | Conventional Example-2 | Experimented Example-1 | Experimented Example-2 |
|---|---|---|---|---|
| Height differences protection layer/second surface electrode ($\mu$m) | −5 | 0 | 5 | 10 |
| Exp. Unacceptable Results Connections | 25 | 2 | 0 | 0 |
| (*) Off-angle Mountings | 105 | 13 | 2 | 0 |

(*): Unacceptable connections for mounting 10.0000 samples

As shown in Table 3, since the invented resistors are provided with second surface electrode layers disposed at a height higher than the surface of protection layer by more than 5 microns, the number of unacceptable connections are far less than the cases obtained with conventional resistors.

Likewise, Table 4 shows relationships between the heights of side electrode layers above the surface of protection layers and the unacceptable connections.

TABLE 4

|  | Conventional Example-1 | Conventional Example-2 | Experimented Example-1 | Experimented Example-2 |
|---|---|---|---|---|
| Height ratios protection layer/ side-electrode ($\mu$m) | −10 | 0 | 10 | 20 |
| Exp. Unacceptable Results Connections | 20 | 1 | 0 | 0 |
| (*) Mounting Off-Angle | 100 | 14 | 0 | 0 |

(*): Unacceptable connections for mounting 10.0000 samples

As shown in Table 4, since the invented resistors are provided with the side electrode layers disposed at a height higher than the surface of protection layer by more than 10 microns, the number of unacceptable connections are far less than the cases of conventional resistors.

Figure 11:
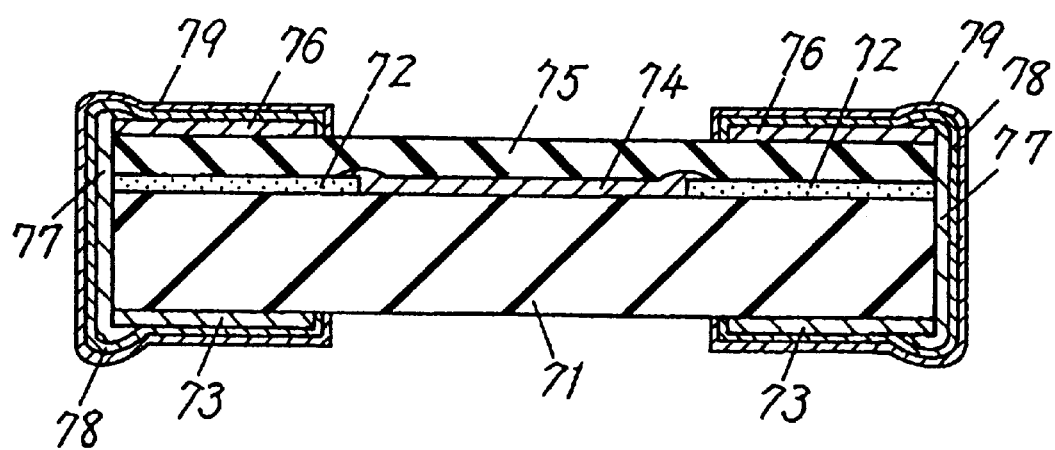
FIG. 11 show a cross-section of the resistor which is a fourth embodiment of the invention.

The resistors and its manufacturing method of a fourth embodiment of the invention are now explained by referring the attached drawings. FIG. 11 shows a cross-section of the resistor which is a fourth embodiment of the invention. In FIG. 11, 71 is a substrate made of alumina or others, 72 are a pair of first surface electrode layers made of a mixed material consisted of silver and glass disposed on both end surfaces of substrate 71, and are preferably disposed up to the ends of side of substrate 71. 73 are a pair of back electrode layers made of a mixed material consisted of silver and glass disposed on the both ends of the back surface of substrate 71, which are preferably disposed up to the side ends of substrate 71. 74 is a resistor layer made of a mixed material consisted of ruthenium oxide and glass disposed on the surface of substrate 71 and superposed on to the both ends of first surface electrode layers 72 making electrical connections thereto. 75 is a protection layer made of boro-silicate lead glass disposed to cover at least first surface electrode layer 72 and resistor layer 74, and is preferably extended to the side end of substrate 71. 76 are a pair of second surface electrode layers made of a mixed material consisted of silver and glass disposed on the both ends of protection layer 75, and is preferably disposed up to the side-end of substrate 71 having a shape same as the one of back electrode layer 73. 77 is a side electrode layer made of a mixed material consisted of silver and glass disposed to electrically combine the sides of substrate 71, first surface electrode layer 72, and the both ends of second surface electrode layer 76, where said side-electrode layers are preferably provided with rounded edges. 78 is an electro-plated layer such as a nickel plated layer disposed to cover side-electrode layer 77 if necessary. 79 is a solder layer disposed preferably to cover nickel-plated layer 78, where the edges of solder layer 79 are preferably provided with rounded edges.

For the resistors of above-explained construction, its manufacturing method is now explained below by referring the attached drawings FIGS. 12 and 13 showing manufacturing processes of the resistor which is a fourth embodiment of the invention.

As shown in FIG. 12(a), a mixed paste material made of silver and glass is screen-prlnted on sheet-shaped substrate 82 made of alumina provided with horizontal and vertical dividing grooves 81 in order to cross the horizontal dividing groove 81, and the paste is dried. Next, a mixed paste material made of silver and glass is screen-printed on the back surface of sheet-shaped substrate 82 provided with horizontal and vertical dividing grooves (not shown). Then, placed in a belt-type continuous furnace, the paste is sintered at a temperature of about 850° C. for a period of about 45 minutes, forming first surface electrode layer 83 and back electrode layer 84.

As shown in FIG. 12(b), then, after a mixed paste material made of ruthenium oxide and glass is screen-printed on the edges of first surface electrode layers disposed on sheet-shaped substrate 82 establishing superposed areas and electrical connections there between on the both ends of first suface electrode layers, the paste is dried and sintered in a belt-type continuous furnace at a temperature of about 850° C. for a period of about 45 minutes, forming resistor layers 85.

As shown in FIG. 12(c), by means of a laser trimmer, the resistance of resistor layer is trimmed and trimming grooves 86 are formed. However, said trimming grooves 86 may be formed by applying said laser trimmer through a coating layer (not shown), trimming both said coating layer and the resistor layer 85 which are deposited in advance.

Then, as shown in FIG. 12(d), after a paste made of boro-silicate lead glass is screen-prlnted on first surface electrode layer 83 and resistor layer 85 covering of these surfaces, the paste is dried and is sintered in a belt-type continuous furnace and at a temperature of about 600° C. for a period of about 45 minutes, forming protection layer 87. In this case, protection layer 87 has to be disposed to cover at least the surfaces of first surface electrode layer 83 and resistor layer 85.

Figure 13A:
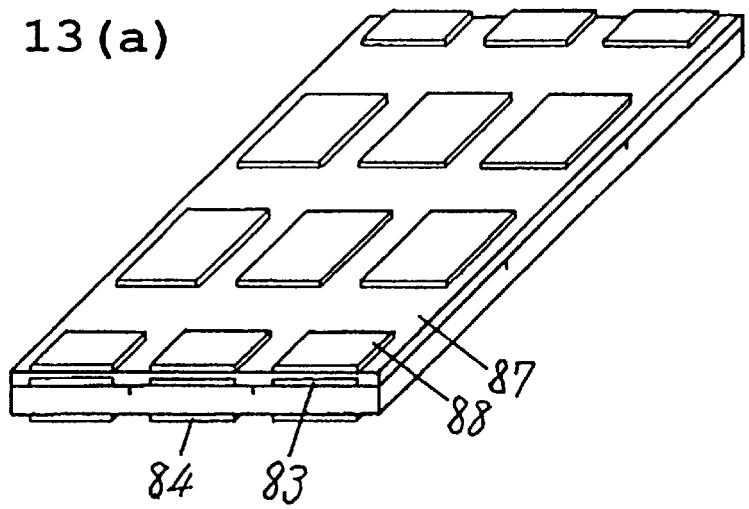
FIGS. 13(a)–13(d) show manufacturing processes of the same.

Then, as shown in FIG. 13(a), after a mixed paste made of silver and glass is screen-printed on the surface of protection layer 87, the paste is dried and sintered in a belt-type continu-ous furnace at a temperature of about 600° C. for a period of about 45 minutes forming second surface electrode layer 88.

Figure 13B:
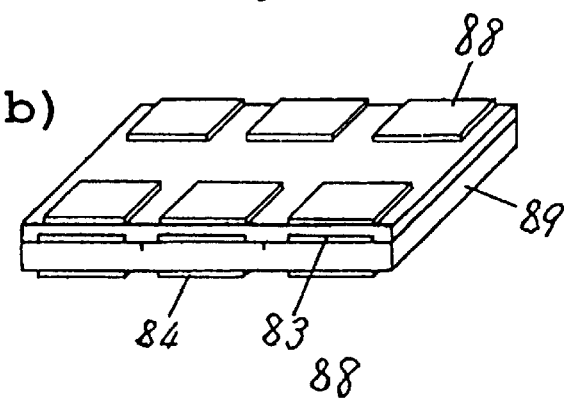

As shown in FIG. 13(b), then, by dividing sheet-shaped subs-trate 82 along dividing grooves 81, first and second surface electrode layers are exposed from the sides of substrate, rectangular substrates 89 are formed.

Figure 13C:
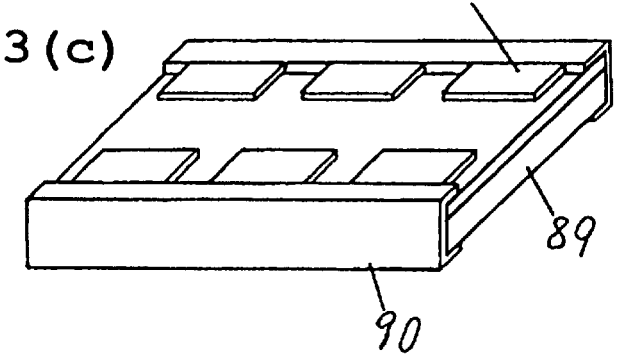
Figure 13D:
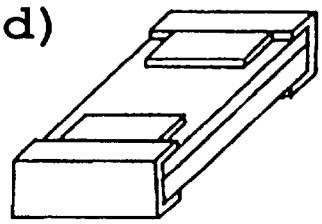

As shown in FIG. 13(c) in next, a mixed paste made of silver and glass is transfer-printed in order to electrically connect first surface electrode layer 83 and second surface electrode layer 88. After this, the paste is dried and is sintered in a belt-system continuous furnace at a temperature of about 600° C. for a period of about 45 minutes, and side-electrode layer 90 is formed. Then, individual resistors are formed by dividing rectan-gular substrate 89 into individual resistors as shown in FIG. 13(d).

Then, according to the necessity, an electro-plated layer (not shown) made of a nickel plated layer or others, is formed to cover side-electrode layer 90, and at the same time, a solder layer (not shown) made of an alloy of tin and lead covering said plated layer is disposed, and by this, the resistors are produced at the last.

The experimental results mounting the resistors having an above-explained construction and the conventional resistors mounted on circuit-boards are explained in below. The experi-mental method and the judgments of the results employed in these case are identical with those shown in a first embodiment of the invention.

Table 5 shows experimental results obtained with the resistors of a fourth construction and the relationships between the heights of second surface electrode layers above the surface of protection layers and the number of unacceptable mountings with the conventional resistors.

TABLE 5

|  | Conventional Example-1 | Conventional Example-2 | Experimented Example-1 | Experimented Example-2 |
|---|---|---|---|---|
| Height differences protection layer/ second surface electrode ($\mu$m) | −5 | 0 | 5 | 10 |
| Exp. Unacceptable Results Connections | 26 | 3 | 0 | 0 |
| (*) Off-angle Mountings | 98 | 12 | 1 | 0 |

(*): Unacceptable connections for mounting 10.0000 samples

As shown in Table 5, since the invented resistors are provided with second surface electrode layers disposed at a height higher than the surface of protection layer by more than 5 microns, the numbers of unacceptable connections are far less than the cases obtained with the conventional resistors.

Likewise, Table 6 shows relationships between the heights of side-electrode layer above the protection layers and the unacceptable mountings.

TABLE 6

|  | Conventional Example-1 | Conventional Example-2 | Experimented Example-1 | Experimented Example-2 |
|---|---|---|---|---|
| Height differences protection layer/ side-electrode ($\mu$m) | −10 | 0 | 10 | 20 |
| Exp. Unacceptable Results Connections | 22 | 3 | 0 | 0 |
| (*) Off-angle Mountings | 101 | 12 | 0 | 0 |

(*): Unacceptable connections for mounting 10.0000 samples

As shown in Table 6, since the resistors of this embodiment of the invention are provided with the side-electrode layers disposed at a height higher than the surface of protection layer by more than 10 microns, the numbers of unacceptable connections are far less than the cases using the conventional resistors.

Figure 14:
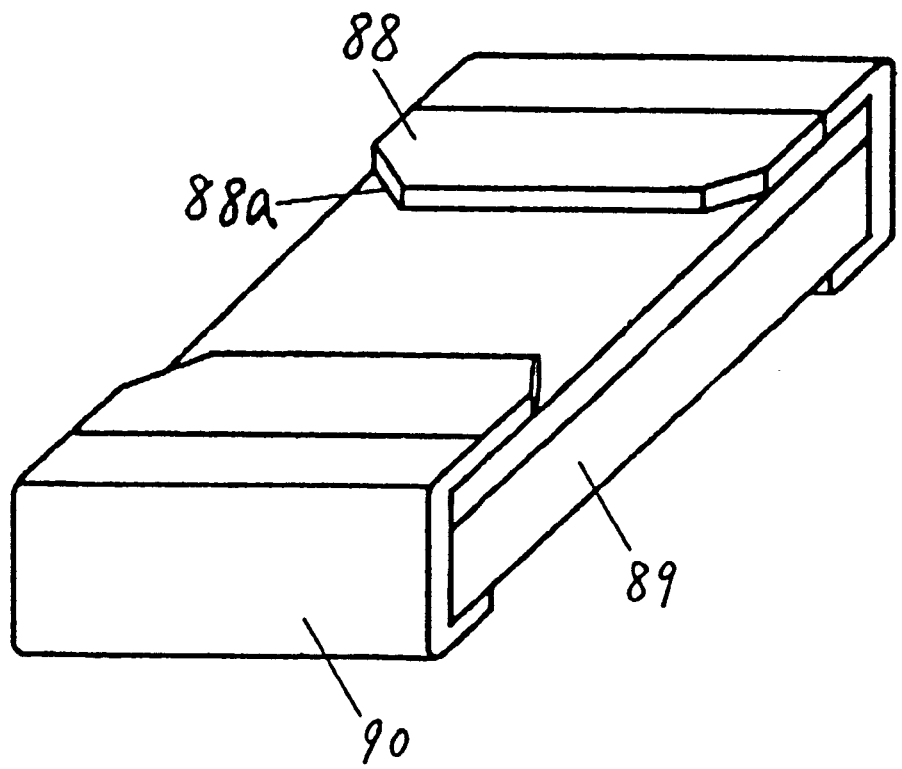
FIG. 14 shows a perspective view of the resistor which is a fifth embodiment of the invention.

The resistors of a fifth embodiment of the invention are now explained by referring the attached drawings. FIG. 14 shows a perspective view of the resistor of a fifth embodiment of the invention, and the differences of this from third and fourth embodiments of the invention are that second surface electrode layer 88 of the resistor divided into individual resistor pieces is provided with a width same as the width of substrate 89 as shown in FIG. 14 and those are provided with notched corners 88a on the corners of mutually facing edges of second surface electrode layer. By providing these notches 88a, the bonding area are enlarged and the bonding strength are increased, and at the same time, the possible peeling of resistor from the circuit board are prevented.

Figure 15A:
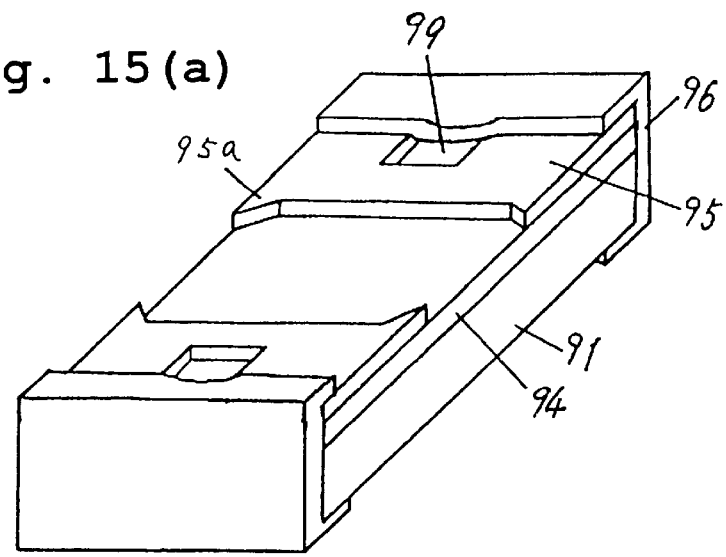
FIGS. 15(a) and 15(b) show a perspective view of the resistor which is a sixth embodiment of the invention.
Figure 15B:
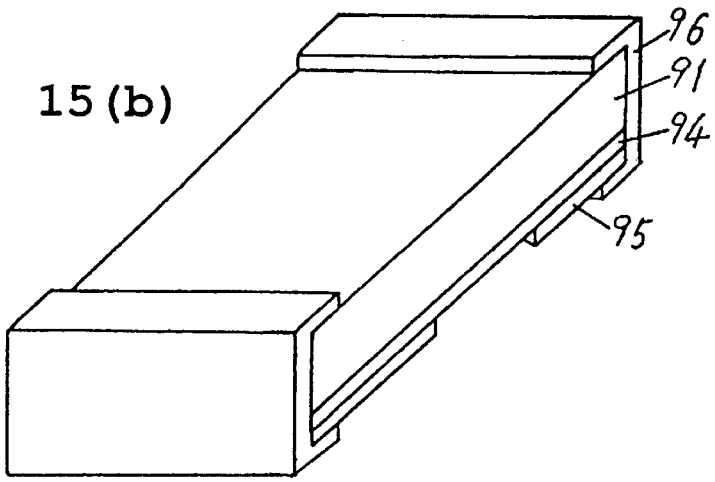
Figure 16:
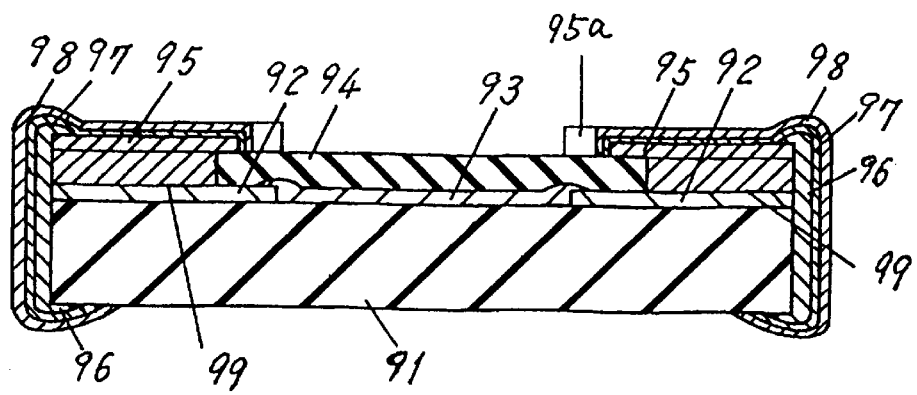
FIG. 16 shows a cross-section of the same resistor.
Figure 18A:
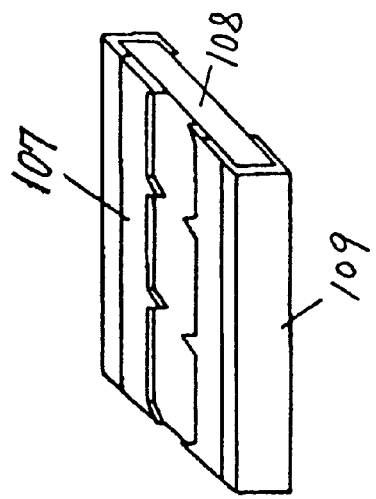
FIGS. 18(a)–18(d) show manufacturing processes of the same resistor.
Figure 18C:
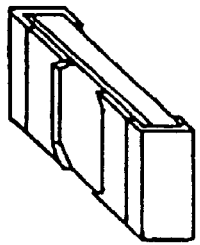
Figure 18B:
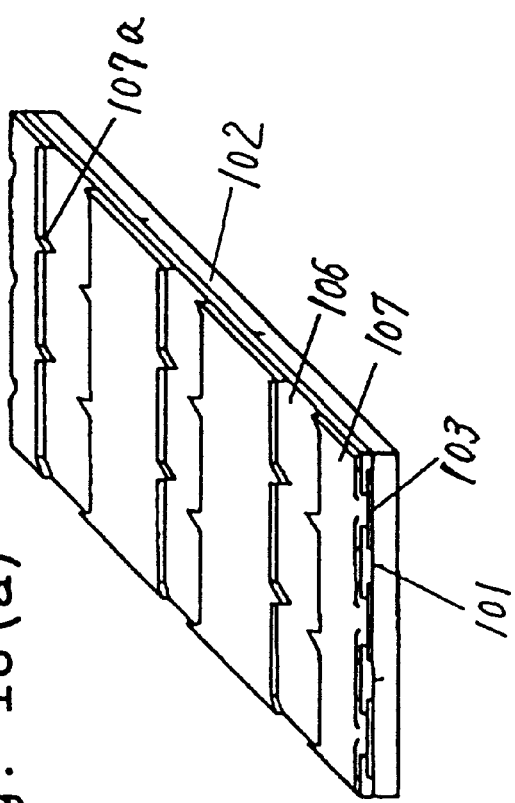
Figure 18D:
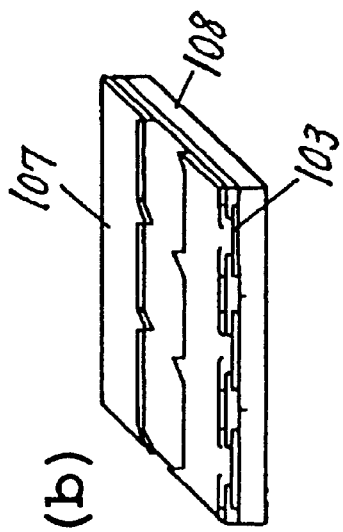

The resistors of a sixth embodiment of the invention and its manufacturing method are now explained by referring the attached drawings. FIG. 15(a) shows a perspective view of the resistor of a sixth embodiment of the invention, and FIG. 15(b) is a perspective view from the back of the same, and FIG. 16 shows a cross-section of the same. In FIGS. 15 and 16, 91 is a substrate made of alumina or others, 92 are a pair of first surface electrode layers made of a mixed material consisted of silver and glass disposed on both end surfaces of substrate 91, and these are preferably extended to the side ends of substrate 91.

93 is a resistor layer made of a mixed material consisted of ruthenium oxide and glass superposed on the both ends of first surface electrode layer 92 making electrical connections there between. 94 is a protection layer made either of a boro-silicate lead glass or an epoxy system resin disposed to cover first surface electrode layer 92 and resistor layer 92, having window 99 disposed on first surface electrode layer 92, and these are preferably disposed up to the side of substrate 91.

95s are a pair of second surface electrode layers made of a mixed material consisted of silver and glass or a phenol resin system resin disposed on the side of protection layer 94 in order to be electrically connected to first surface electrode layer 92 through window 99 disposed on protection layer 94, and this is preferably disposed up to the side of substrate 61. A pair of angled corners 95a disposed on the mutually facing edges of second surface electrode layer 95 are provided with protrusions respectively as shown in FIG. 15(a).

96s are side-electrode layers made of a mixed material consisted of silver and glass disposed on the sides of substrate 91 and on first and second surface electrode layers 92 and 95 to make electric connections, and side-electrode layer 96 are provided with rounded edges. 97 is an electroplated layer such as a nickel-plated layer disposed to cover side-electrode layer 97 if necessary. 98 is a solder layer disposed to cover said nickel-plated layer 97 if necessary, and preferably solder layer 98 is provided with rounded edges.

As for the invented resistor of abode-shown construction, its manufacturing method is explained in below by referring the attached drawings. FIGS. 17 and 18 show manufacturing processes of the resistor which is a sixth embodiment of the invention. As shown in FIG. 17(a), after a mixed paste material consisted of silver and glass is screen-printed on sheet-shaped substrate 102 made of alumina provided with vertical and horizontal divid-ing grooves 101 crossing over horizontal dividing grooves 101, the paste is dried and sintered in a belt-type continuous furnace at a temperature of about 850° C. for a period of about 45 minutes, forming first surface electrode layers 103.

In next, as shown in FIG. 17(b), a mixed paste material consisted of ruthenium oxide and glass is screen-printed on each end of first surface electrode layers 103 disposed on sheet-shaped substrate 102 making electrical connections between the first surface electrode layers 103. Then, after this, the paste is dried and sintered in a belt-type continuous furnace at a temperature of about 850° C. for a period of about 45 minutes, forming resistor layer 104.

Then, as shown in FIG. 17(c), a trimming process by using a laser trimmer is performed in order to trim the resistance of resistor layer 104, forming trimming grooves 106. However, said trimming process may be performed after at least the surface of resistor layer 104 is coated by glass and trimming grooves 105 are formed by trimming the coated layer (not shown) and resistor layer 104 simultaneously through the coating layer (not shown) disposed on resistor layer 104.

As shown in FIG. 17(d), a paste made of boro-sIllcate lead glass is screen-printed to cover first surface electrode layer 103 and resistor layer 104, making window 110 disposed on first surface electrode layer 103. After this, the paste is dried and sintered in a belt-type continuous furnace at a temperature of about 600° C. for a period of about 45 minutes, forming protection layer 106. At this time, protection layer 106 has to be deposited to cover at least first surface electrode layer 103 and resistor layer 104.

Then, as shown in FIG. 18(*a*), after a mixed paste material consisted of silver and glass is screen-printed establishing electrical connections to the first surface electrode layer through window 110 of protection layer 106, the paste is dried and sintered in a belt-system continuous furnace at a temperature of about 600° C. for a period of about 45 minutes, forming second surface electrode layers 107.

At this time, corners 107*a* each having a shape of protrusion 107*a* are provided on the mutually facing edge surfaces of second surface electrode layer 107 disposed along vertical dividing grooves 101 provided on sheet-shaped substrate 102.

Then, as shown in FIG.18(*b*) next, sheet-shaped substrate 102 is divided along dividing grooves 101 exposing first and second surface electrode layers from the sides of substrate, forming rectangular substrates 108.

As shown in FIG. 18(*c*) in next, after a mixed paste material consisted of silver and glass is transfer-printed by a roller on the side of rectangular substrate 108 in order to electrically connect first surface electrode layer 103 to second surface electrode layer 107, the paste is dried and sintered in a belt-type continuous furnace at a temperature of about 600° C. for a period of about 45 minutes, forming side-electrode layers 109.

Then, as shown in FIG. 18(*d*), rectangular substrate 108 is divided into individual substrates forming individual resistor pieces.

At the last, after forming an electro-plated layer (not shown) made of electro-plated nickel covering the side electrode layer 109 if necessary, a solder layer (not shown) of electro-plated alloy made of tin and lead covering said electro-plated layer is disposed if necessary, and the individual resistors are obtained.

The experimental results mounting the resistors having above-explained constructions and the conventional resistors on clrcuit-boards are explained in below. The experimental methods and the method of judgment employed in these experiments are identical with those shown in a first embodiment of the invention.

Table 7 shows experimental results obtained with the resistors having a sixth embodiment and relationships between the heights of second surface electrode layers above the protection layers and the number of unacceptable mountings for the conventional resistors.

TABLE 7

|  | Conventional Example-1 | Conventional Example-2 | Experimented Example-1 | Experimented Example-2 |
|---|---|---|---|---|
| Height differences protection layer/ second surface electrode (µm) | −5 | 0 | 5 | 10 |
| Exp. Unacceptable Results Connections | 18 | 3 | 0 | 0 |
| (*) Off-angle Mountings | 50 | 7 | 0 | 0 |

(*): Unacceptable connections for mounting 10.0000 samples

As shown in Table 7, since the resistors of this embodiment of the invention are provided with the second surface electrode layers disposed at a height higher than the surface of protection layer by more than 5 microns, the number of unacceptable connections are far less than those in the cases of conventional resistors.

Likewise, Table 8 shows relationships between the heights of side-electrode layers above the surface of protection layers and the unacceptable connections.

TABLE 8

|  | Conventional Example-1 | Conventional Example-2 | Experimented Example-1 | Experimented Example-2 |
|---|---|---|---|---|
| Height differences protection layer/ side-electrode (µm) | −10 | 0 | 10 | 20 |
| Exp. Unacceptable Results Connections | 14 | 1 | 0 | 0 |
| (*) Off-angle Mountings | 61 | 6 | 0 | 0 |

(*): Unacceptable connections for mounting 10.0000 samples.

As shown in Table 8, since the resistors of this embodiment of the invention are provided with side-electrode layers disposed at a height higher than the surface of protection layer by more than 10 microns, the numbers of unacceptable connections are far less than the cases of conventional resistors.

Figure 19A:
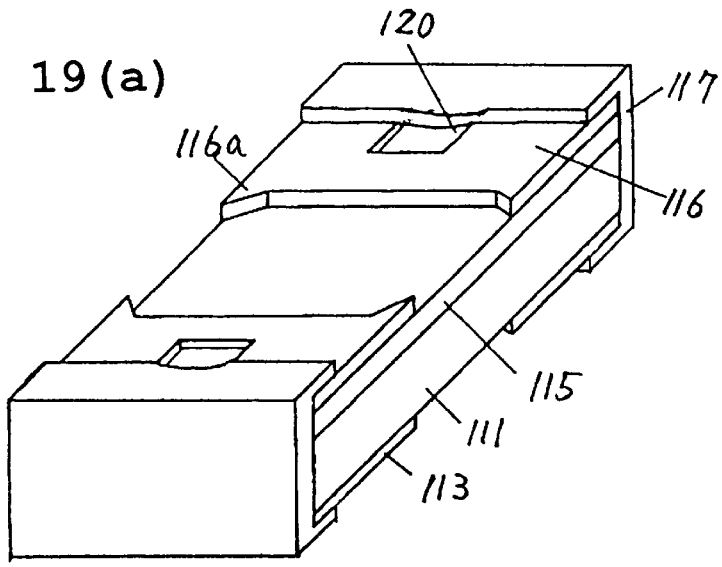
FIGS. 19(a) and 19(b) show a perspective view of the resistor which is a seventh embodiment of the invention.
Figure 19B:
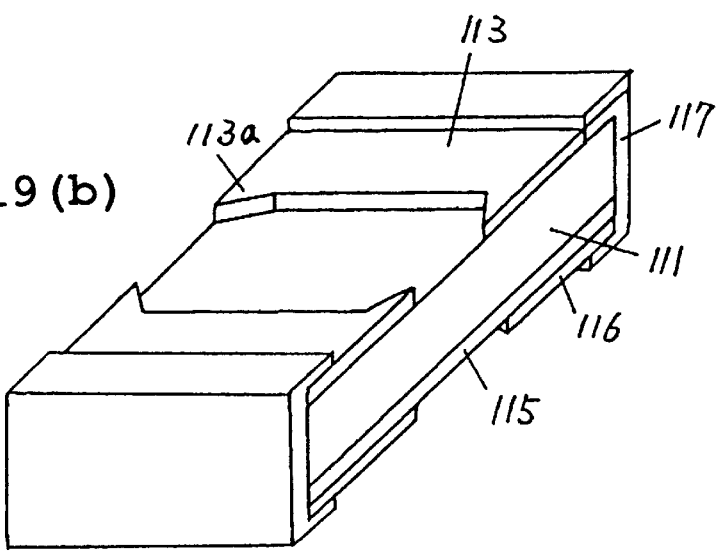
Figure 20:
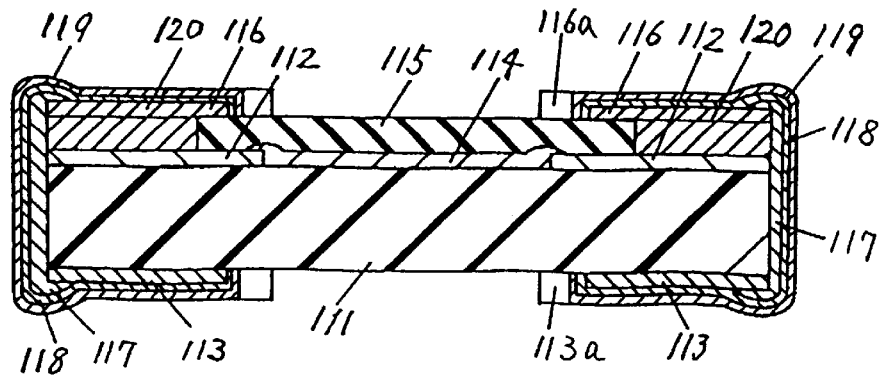
FIG. 20 shows a cross-section of the same resistor.
Figure 24A:
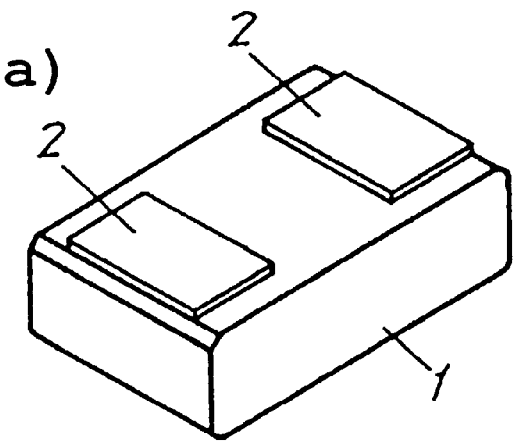
FIGS. 24(a)–24(c) show manufacturing processes of the same resistor.
Figure 24B:
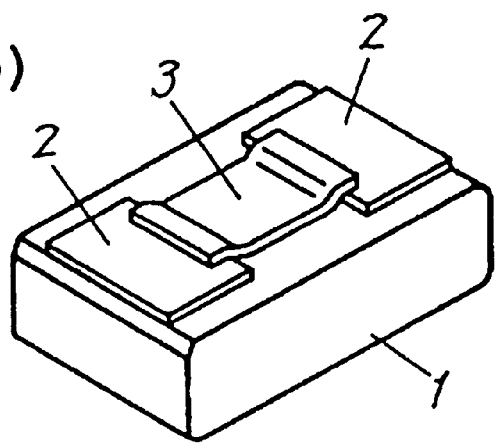
Figure 24C:
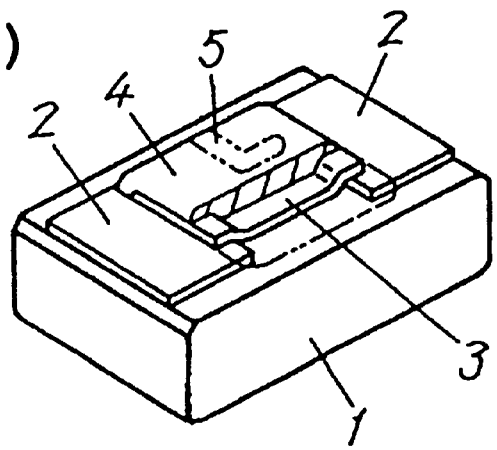
Figure 25A:
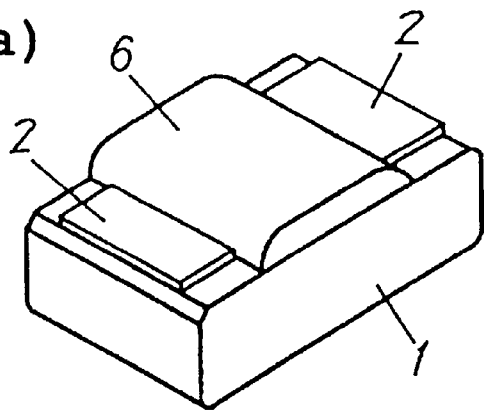
FIGS. 25(a)–25(c) show manufacturing processes of the same.
Figure 25B:
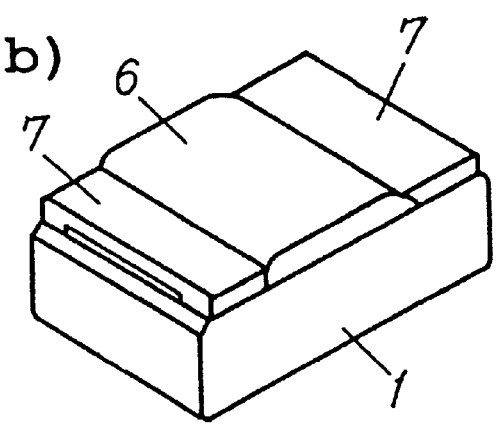
Figure 25C:
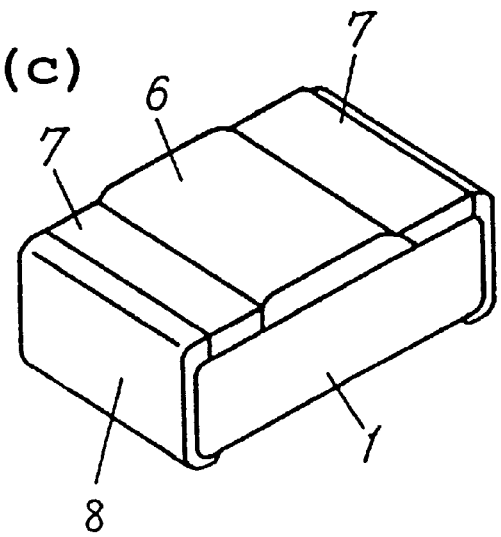

The resistor which is a seventh embodiment of the invention is now explained by referring the attached drawings. FIG. 19(*a*) shows a higher perspective view of resistor which is a seventh embodiment of the invention, FIG. 19(*b*) is a perspective view viewed from the back, and FIG. 20 shows a cross-section of the same resistor.

In these drawings, 111 is a substrate made of alumina or others, 112*s* are a pair of first surface electrode layers made of a mixed material consisted of silver and glass disposed on both ends of the surface of substrate 111, and are disposed preferably up to the side ends of substrate 111.

113*s* are a pair of back surface electrode layers made of a mixed material consisted of silver and glass disposed on both ends of the back of substrate 111, like a case of first surface electrode layer 112, this should preferably be disposed up to the side-ends of substrate 111. Corner parts 113*s* of back electrode layer 113 are disposed at both mutually facing ends of the edges of a pair of back electrode layers. 114 is a resistor layer made of a mixed material consisted of ruthenium oxide and glass disposed on the surface of substrate 111 and superposed on both ends of first surface electrode layer 112 establishing electrical connections there between. 115 is a protection layer made of boro-silicate lead glass disposed to cover the surfaces of first upper electrode layer 112 and resistor layer 114 having window 120 on first surface electrode layer 112, and this layer should preferably be disposed up to the sides of substrate 111.

116*s* are a pair of second surface electrode layers made of a mixed material consisted of silver and glass disposed on both ends of the surface of protection layer 115 electrically connecting protection layer 115 to first surface electrode layer 112 through window 120 disposed on protection layer 115, and this should preferably be disposed up to the sides of substrate 111, and should also have a shape same as the back electrode 113.

The corner parts 116*a* of second surface electrode layer 116 are disposed on both sides of a pair of the mutually facing edges of second surface electrode layer 116. 117*s* are side-electrode layers made of a mixed material consisted of silver and glass disposed to electrically connect first and second surface electrode layers 112 and 116, and side-electrode layers 117 which are provided with rounded edges.

118 is an electro-plated layer such as a nickel-plated layer disposed to cover side-electrode layers 117 if necessary, and 119 is a solder layer disposed to cover nickel-plated layer 118 and solder layer 119 is preferably provided with rounded edges.

With the resistors of a construction of above, its manufacturing method is now explained in below by referring the attached drawings.

FIGS. 21 and 22 show manufacturing processes of a resistor which is a seventh embodiment of the invention. As shown in FIG. 21(a), a mixed paste material consisted of silver and glass is screen-printed on sheet-shaped substrate 122 made of alumina provided with vertical and horizontal dividing grooves 121 on its surface and back, crossing horizontal dividing grooves 121. After the paste is dried, the same paste made of silver and glass is screen-printed on the back of sheet-shaped substrate 122 crossing the dividing grooves (not shown) and dried. After this, the paste is sintered in a belt-type continuous furnace at a temperature of about 850° C. for a period of about 45 minutes, forming first surface electrode layer 123 and back electrode layer 124. At this time, the corners (not shown) of back electrode layer 124 are disposed at the edges where a pair of edges of back electrode layer 124 face each other.

As shown in FIG. 21 (b) in next, after a mixed paste material consisted of ruthenium oxide and glass is screen-printed on sheet-shaped substrate 122 in order to overlap the both ends of first surface electrode layers 123 and to electrically combine first surface electrode layers 123, the paste is dried and sintered in a belt-system continuous furnace at a temperature of about 850° C. for a period of about 45 minutes, and resistor layers 125 are formed by this.

Then, as shown in FIG. 21(c), a trimming process is perform-ed in order to trim the resistance of resistor layer 125, forming trimming grooves 126. However, said trimming processes 126 may be formed after at least the surface of resistor layer 125 (not shown) is coated by glass, and by trimming the glass-coated layer and resistor layer 125 together through the coated layer by using a laser trimmer.

As shown in FIG. 21(d), a paste made of boro-silicate lead glass is screen-printed in order to cover first surface electrode layer 123 and resistor layer 125, where window 131 disposed on first upper electrode layer 123. After this, the paste is dried and sintered in a belt-system continuous furnace at a temperature of about 600° C. for a period of about 45 minutes, forming protection layer 127. Then, as shown in FIG. 22(a), after a mixed paste material consisted of silver and glass is screen-printed on first surface electrode layer in order to establish an electrical connection thereto through window 131 of protection layer 127, the paste is dried and sintered in a belt-type continuous furnace at a temperature of about 600° C. for a period of about 45 minutes, forming second surface electrode layers 128.

At this time, corner parts 128s each having a shape of protrusion are disposed on the mutually facing edges of second surface electrode layer 128 disposed along vertical dividing grooves 121 provided on sheet-shaped substrate 122.

Then in next, as shown in FIG. 22(b), sheet-shaped substrate 122 is divided along dividing grooves 121 exposing first and second surface electrode layers from the side of substrate, forming rectangular substrates 129.

As shown In FIG. 22(c), after a mixed paste material consisted of silver and glass is then transfer-printed by a roller in order to establish electrical connections between first surface electrode layer 123 and second surface electrode layer, the paste is dried and sintered in a belt-system continuous furnace at a temperature of about 600° C. for a period of about 45 minutes, forming a pair of side-electrode layers 130.

Then, as shown in FIG. 22(d), rectangular-shaped substrate 129 is divided in individual substrates forming individual resistor pieces.

At the last, as forming an electro-plated layer (not shown) such as a nickel-plated layer covering the side-electrode layer 130 according to the necessity, a solder layer (not shown) made of a layer of alloy consisted of tin and lead covering said nickel-plated layer is disposed, and the resistors are obtained.

The experimental results mounting the resistors having the above-explained constructions and the conventional resistors on clrcult-boards are explained in below. The experimental methods and the method of judgment of the results employed in these experiments are identical with those shown in the first embodiment of the invention.

Table 9 shows experimental results obtained with the resistors having a seventh construction and relationships between the heights of second surface electrode layers above the surface of protection layers and the unacceptable connections of conventional resistors.

TABLE 9

|  | Conventional Example-1 | Conventional Example-2 | Experimented Example-1 | Experimented Example-2 |
| --- | --- | --- | --- | --- |
| Height differences protection layer/ second surface electrode ($\mu$m) | −5 | 0 | 5 | 10 |
| Exp. Unacceptable Results Connections | 17 | 2 | 0 | 0 |
| (*) Off-angle Mountings | 56 | 8 | 0 | 0 |

(*): Unacceptable connections for mounting 10.0000 samples

As shown in Table 9, since the resistors of this embodiment of the invention are provided with second surface electrode layers disposed at a height higher than the surface of protection layer by more than 5 microns, and corners disposed respectively on the edges of second surface electrode layer and back electrode layer, the numbers of unacceptable connections are far less than the cases employing the conventional resistors.

Likewise, Table 10 shows relationships between the heights of side-electrode layer above the surface of protection layers and the unacceptable connections.

TABLE 10

|  | Conventional Example-1 | Conventional Example-2 | Experimented Example-1 | Experimented Example-2 |
| --- | --- | --- | --- | --- |
| Height differences protection layer/ side-electrode ($\mu$m) | −10 | 0 | 10 | 20 |
| Exp. Unacceptable Results Connections | 16 | 1 | 0 | 0 |
| (*) Off-angle Mountings | 63 | 7 | 0 | 0 |

(*): Unacceptable connections for mounting 10.0000 samples

As shown in Table 10, since the resistors of this embodiment of the invention are provided with side-electrode layers disposed at a height higher than the surface of protection layer by more than 10 microns, the number of unacceptable connections are far less than the cases of conventional resistors.

According to the resistors of this invention, since the side-electrode layer or the second surface electrode layer is disposed at a height higher than the protection layer, the resistors can be mounted on the circuit board regardless the surface or the back of resistors with excellent mounting reliability.

We claim:

1. A resistor comprising:

a substrate having an upper surface, a first surface electrode disposed on said upper surface of said substrate adjacent a first side surface of said substrate and a second surface electrode disposed on said upper surface of said substrate adjacent a second side surface of said substrate, a resistor layer disposed on said upper surface of said substrate, said resistor layer electrically coupling said first surface electrode and said second surface electrode, said resistor layer extending over only a portion of the width of said substrate, a protection layer covering said resistor layer, a first side-electrode formed on the first side of said substrate and on said first surface electrode, said first side electrode electrically coupled to said first surface electrode, and a second side-electrode formed on the second side of said substrate and on said second surface electrode, said second side electrode electrically coupled to said second surface electrode, each of said first side-electrode and said second side-electrode having an upper surface which is separated from an upper surface of said protection layer by at least 5 microns, wherein at least one of said first surface electrode and said second surface electrode is provided with at least one notch, said at least one notch including a planar surface which extends farther away from at least one of said first side surface and said second side surface than said at least one of said first surface electrode and said second surface electrode.

2. A resistor comprising:

a substrate having an upper surface and a bottom surface, a first surface electrode disposed on said upper surface of said substrate adjacent a first side surface of said substrate and a second surface electrode disposed on said upper surface of said substrate adjacent a second side surface of said substrate, a first back electrode disposed on said bottom surface of said substrate adjacent a first side surface of said substrate and a second back electrode disposed on said bottom surface of said substrate adjacent a second side surface of said substrate, a resistor layer disposed on said upper surface of said substrate, said resistor layer electrically coupling said first surface electrode and said second surface electrode, said resistor layer extending over only a portion of the width of said substrate, a protection layer covering said resistor layer, a first side-electrode formed on the first side of said substrate, said first surface electrode and said first back electrode, said first side electrode electrically coupled to said first surface electrode and said first back electrode, and a second side-electrode formed on the second side of said substrate, said second surface electrode and said second back electrode, said second side electrode electrically coupled to said second surface electrode and said second back electrode, each of said first side-electrode and said second side-electrode having an upper surface which is separated from an upper surface of said protection layer by at least 5 microns, wherein at least one of said first surface electrode and said second surface electrode is provided with at least one notch, said at least one notch including a planar surface which extends farther away from at least one of said first side surface and said second side surface than said at least one of said first surface electrode and said second surface electrode.

3. A resistor comprising:

a substrate having an upper surface, a first surface electrode disposed directly on said upper surface of said substrate adjacent a first side surface of said substrate and a second surface electrode disposed directly on said upper surface of said substrate adjacent a second side surface of said substrate, a resistor layer disposed on said upper surface of said substrate, said resistor layer electrically coupling said first surface electrode and said second surface electrode, said resistor layer extending over only a portion of the width of said substrate, a protection layer covering said resistor layer, said first surface electrode and said second surface electrode, a third surface electrode disposed only on said protection layer adjacent said first side surface of said substrate, said third surface electrode not contacting said first surface electrode, and a fourth surface electrode disposed only on said protection layer adjacent said second side surface of said substrate, said fourth surface electrode not contacting said second surface electrode, a first side-electrode formed on the first side of said substrate, said first side-electrode electrically coupled to said first surface electrode and said third surface electrode, and a second side-electrode formed on the second side of said substrate, said second side electrode electrically coupled to said second surface electrode and said fourth surface electrode, each of said first side-electrode and said second side-electrode having an upper surface which is separated from an upper surface of said protection layer by at least 5 microns, wherein at least one of said third surface electrode and said fourth surface electrode is provided with at least one notch said at least one notch including a planar surface which extends farther away from at least one of said first side surface and said second side surface than said at least one of said third surface electrode and said fourth surface electrode.

4. A resistor comprising:

a substrate having an upper surface and a bottom surface, a first surface electrode disposed directly on said upper surface of said substrate adjacent a first side surface of said substrate and a second surface electrode disposed directly on said upper surface of said substrate adjacent a second side surface of said substrate, a resistor layer disposed on said upper surface of said substrate, said resistor layer electrically coupling said first surface electrode and said second surface electrode, said resistor layer extending over only a portion of the width of said substrate, a first back electrode disposed on said bottom surface of said substrate adjacent said first side surface of said substrate and a second back electrode disposed on said bottom surface of said substrate adjacent said second side surface of said substrate, a protection layer covering said resistor layer, said first surface electrode and said second surface electrode, a third surface electrode disposed only on said protection layer adjacent said first side surface of said substrate, said third surface electrode not contacting said first surface electrode, and a fourth surface electrode disposed only on said protection layer adjacent said second side surface of said substrate, said fourth surface electrode not contacting said second surface electrode, a first side-electrode formed on the first side of said substrate, said first side-electrode electrically coupled to said first surface electrode, said first back electrode and said third surface electrode, and a second side-electrode formed on the second side of said substrate, said second side electrode electrically coupled to said second surface electrode, said second back electrode and said fourth surface electrode, each of said first side-electrode and said second side-electrode having an upper surface which is separated from an upper surface of said protection layer by at least 5 microns, wherein at least one of said third surface electrode and said fourth surface electrode is provided with at least one notch, said at least one notch including a planar surface which extends farther away from at least one of said first side surface and said second side surface than said at least one of said third surface electrode and said fourth surface electrode.

5. A resistor comprising:

a substrate having an upper surface, a first surface electrode disposed directly on said upper surface of said substrate adjacent a first side surface of said substrate and a second surface electrode disposed directly on said upper surface of said substrate adjacent a second side surface of said substrate, a resistor layer disposed on said upper surface of said substrate, said resistor layer electrically coupling said first surface electrode and said second surface electrode, said resistor layer extending over only a portion of the width of said substrate, a protection layer covering said resistor layer, said first surface electrode and said second surface electrode, a third surface electrode disposed on said protection layer adjacent said first side surface of said substrate, and a fourth surface electrode disposed on said protection layer adjacent said second side surface of said substrate, said third surface electrode having projections extending toward said fourth surface electrode, said fourth surface electrode having projections extending toward said third surface electrode, a first side-electrode formed on the first side of said substrate, said first side-electrode electrically coupled to said first surface electrode and said third surface electrode, and a second side-electrode forned on the second side of said substrate, said second side electrode electrically coupled to said second surface electrode and said fourth surface electrode, each of said first side-electrode and said second side-electrode having an upper surface which is separated from an upper surface of said protection layer by at least 5 microns, wherein said protection layer comprises a plurality of windows which expose portions of said first surface electrode and said second surface electrode, said third surface electrode being electrically coupled to said first surface electrode through one of said plurality of windows, said fourth surface electrode being electrically coupled to said second surface electrode through one of said plurality of windows, wherein at least one of said third surface electrode and said fourth surface electrode is provided with at least one notch, said at least one notch including a planar surface which extends farther away from at least one of said first side surface and said second side surface than said at least one of said third surface electrode and said fourth surface electrode.

6. A resistor comprising:

a substrate having an upper surface and a bottom surface, a first surface electrode disposed directly on said upper surface of said substrate adjacent a first side surface of said substrate and a second surface electrode disposed directly on said upper surface of said substrate adjacent a second side surface of said substrate, a resistor layer disposed on said upper surface of said substrate, said resistor layer electrically coupling said first surface electrode and said second surface electrode, said resistor layer extending over only a portion of the width of said substrate, a first back electrode disposed on said bottom surface of said substrate adjacent said first side surface of said substrate and a second back electrode disposed on said bottom surface of said substrate adjacent said second side surface of said substrate, a protection layer covering said resistor layer, said first surface electrode and said second surface electrode, a third surface electrode disposed on said protection layer adjacent said first side surface of said substrate and a fourth surface electrode disposed on said protection layer adjacent said second side surface of said substrate, said third surface electrode having projections extending toward said fourth surface electrode, said fourth surface electrode having projections extending toward said third surface electrode, a first side-electrode formed on the first side of said substrate, said first side-electrode electrically coupled to said first surface electrode, said first back electrode and said third surface electrode, and a second side-electrode formed on the second side of said substrate, said second side electrode electrically coupled to said second surface electrode, said second back electrode and said fourth surface electrode, each of said first side-electrode and said second side-electrode having an upper surface which is separated from an upper surface of said protection layer by at least 5 microns, wherein said protection layer comprises a plurality of windows which expose portions of said first surface electrode and said second surface electrode, said third surface electrode being electrically coupled to said first surface electrode through one of said plurality of windows, said fourth surface electrode being electrically coupled to said second surface electrode through one of said plurality of windows, wherein at least one of said third surface electrode and said fourth surface electrode is provided with at least one notch, said at least one notch including a planar surface which extends farther away from at least one of said first side surface and said second side surface than said at least one of said third surface electrode and said fourth surface electrode.

7. A resistor according to claim 1 or claim 2 wherein a portion of said first side electrode and a portion of said second side electrode is disposed on a portion of said protection layer.

8. A resistor according to claim 7 wherein said protection layer is disposed over a portion of said first surface electrode and a portion of said second surface electrode.

9. A resistor according to claim 3 or claim 4 wherein said third surface electrode and said fourth surface electrode are provided with a notch.

10. A resistor according to either of claims 3, 4, 5 or 6 wherein said first side electrode and said second side electrode are covered with a solder layer and are disposed at a height higher by more than ten microns above said protection layer.

11. A resistoraccording to claim 10 wherein said side electrode layer and said solder layer comprise corner portions, said corner portions being rounded.

12. A resistor according to either of claims 3, 4, 5 or 6 wherein said first surface electrode and said second surface electrode comprise a silver system material.

13. A resistor according to either of claims 3, 4, 5 or 6 wherein said protection layer is made of a glass or a resin material.

14. A resistor according to either of claims 3, 4, 5 or 6 wherein said third surface electrode and said fourth surface electrode is made of an electro-conductive material containing at least a glass or a resin material.

15. A resistor according to either of claims 3, 4, 5 or 6 wherein said first side electrode and said second side electrode is made of an electro-conductive material containing at least a glass or a resin material.

16. A resistor according to either of claims 3, 4, 5 or 6 wherein said the third surface electrode, the fourth surface electrode and said back electrode layer have the same shape.

\* \* \* \* \*